United States Patent
Liu et al.

(10) Patent No.: US 10,978,344 B2
(45) Date of Patent: Apr. 13, 2021

(54) MELTING LASER ANNEAL OF EPITAXY REGIONS

(71) Applicant: Taiwan Semiconductor Manufacturing Company, Ltd., Hsinchu (TW)

(72) Inventors: Su-Hao Liu, Jhongpu Township (TW); Wen-Yen Chen, Hsicnchu (TW); Tz-Shian Chen, Hsinchu (TW); Cheng-Jung Sung, Tainan (TW); Li-Ting Wang, Hsinchu (TW); Liang-Yin Chen, Hsinchu (TW); Huicheng Chang, Tainan (TW); Yee-Chia Yeo, Hsinchu (TW); Syun-Ming Jang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/549,213

(22) Filed: Aug. 23, 2019

(65) Prior Publication Data
US 2021/0057276 A1 Feb. 25, 2021

(51) Int. Cl.
| H01L 21/768 | (2006.01) |
| H01L 21/02 | (2006.01) |
| H01L 29/78 | (2006.01) |
| H01L 29/66 | (2006.01) |
| H01L 29/08 | (2006.01) |

(52) U.S. Cl.
CPC .. *H01L 21/76897* (2013.01); *H01L 21/02532* (2013.01); *H01L 29/0847* (2013.01); *H01L 29/66795* (2013.01); *H01L 29/785* (2013.01)

(58) Field of Classification Search
CPC ......... H01L 21/76897; H01L 21/02532; H01L 29/785; H01L 29/0847; H01L 29/66795
See application file for complete search history.

(56) References Cited

U.S. PATENT DOCUMENTS

| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 2013/0288438 | A1* | 10/2013 | Jensen ............. H01L 29/66628 438/197 |

(Continued)

*Primary Examiner* — Sitaramarao S Yechuri
(74) *Attorney, Agent, or Firm* — Slater Matsil, LLP

(57) ABSTRACT

A method includes forming a gate stack over a first semiconductor region, removing a second portion of the first semiconductor region on a side of the gate stack to form a recess, growing a second semiconductor region starting from the recess, implanting the second semiconductor region with an impurity, and performing a melting laser anneal on the second semiconductor region. A first portion of the second semiconductor region is molten during the melting laser anneal, and a second and a third portion of the second semiconductor region on opposite sides of the first portion are un-molten.

20 Claims, 27 Drawing Sheets

(56) References Cited

U.S. PATENT DOCUMENTS

| | | | |
|---|---|---|---|
| 2015/0171193 A1* | 6/2015 | Cheng | H01L 29/7848 |
| | | | 438/197 |
| 2018/0076326 A1* | 3/2018 | Roh | H01L 29/165 |
| 2018/0130886 A1* | 5/2018 | Kim | H01L 27/0924 |
| 2018/0145174 A1* | 5/2018 | Glass | H01L 29/161 |

* cited by examiner

US 10,978,344 B2

MELTING LASER ANNEAL OF EPITAXY REGIONS

BACKGROUND

In integrated circuits, source/drain contact plugs are used for electrically coupling to the source and drain regions, which may be formed through epitaxy. The source/drain contact plugs are typically connected to source/drain silicide regions. The formation of the source/drain silicide regions includes forming contact openings by etching dielectric layers covering the source/drain regions, wherein the etched dielectric layers may include a silicon nitride layer and an oxide layer over the silicon nitride layer. The source/drain regions are thus exposed to the contact openings. An additional silicon nitride layer is formed conformally to cover the sidewalls and the bottoms of the contact openings. A second etching step is then performed to remove the bottom portions of the silicon nitride layer to reveal the epitaxy source/drain regions. A metal layer is then formed to extend into the contact openings, and an anneal process is performed to react the metal layer with the source/drain regions, resulting in source/drain silicide regions to be formed. The remaining portions of the contact openings are then filled with a metal(s) to form the source/drain contact plugs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
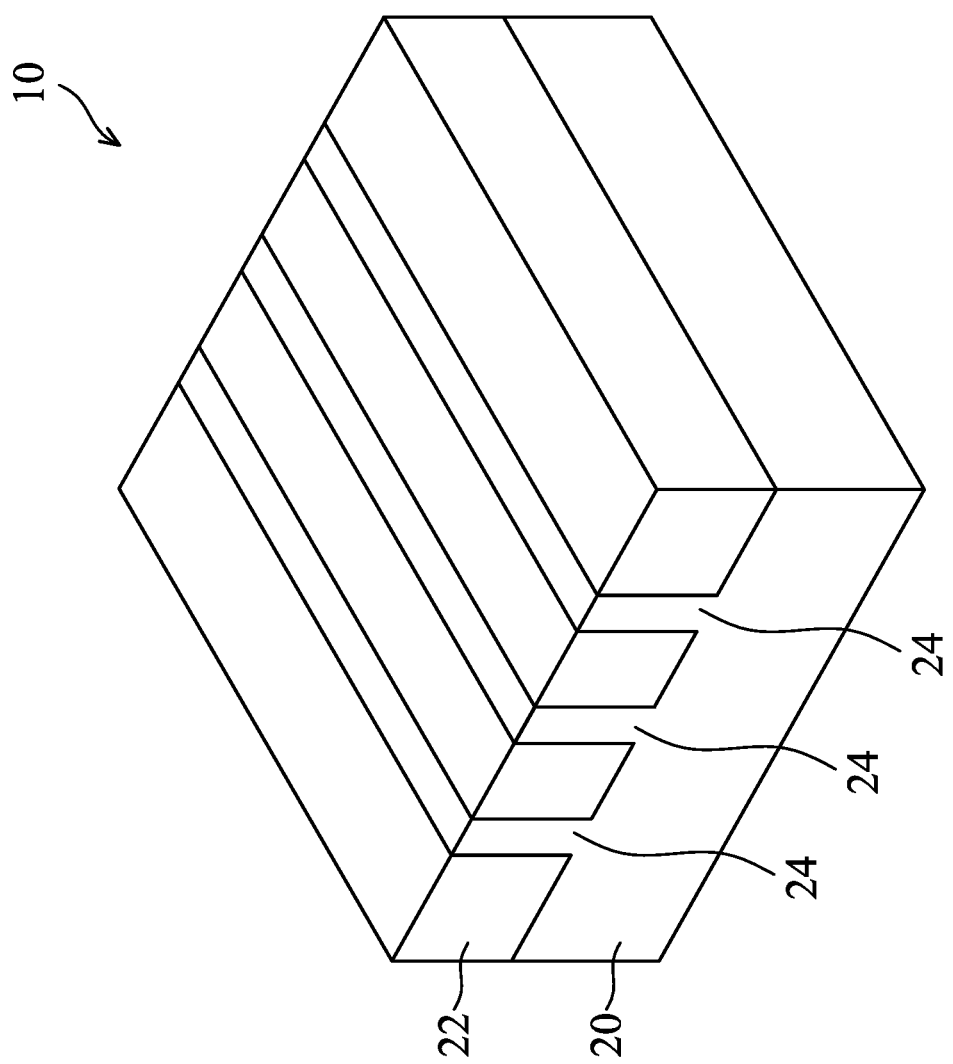
FIGS. 1-4, 5A, 5B, 6A, 6B, 7, 8, 9A, 9B, 9C, 10, 11A, 11B, 11C, 12, 13A, 13B, 13C, and 14 are perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors such as planar transistors may also adopt the concept of the present disclosure. In accordance with some embodiments of the present disclosure, melting laser anneal is used to anneal epitaxy regions (such as source/drain regions) of the FinFETs, during which at least some portions of the source/drain regions are molten. Due to the melting laser anneal, germanium is piled up to the surface regions of the source/drain regions, resulting in higher germanium atomic percentage at the surface regions. The higher germanium percentage results in the Schottky barrier between the source/drain region and the silicide region to be reduced, and hence the contact resistance to the source and drain regions is reduced.

Figure 19:
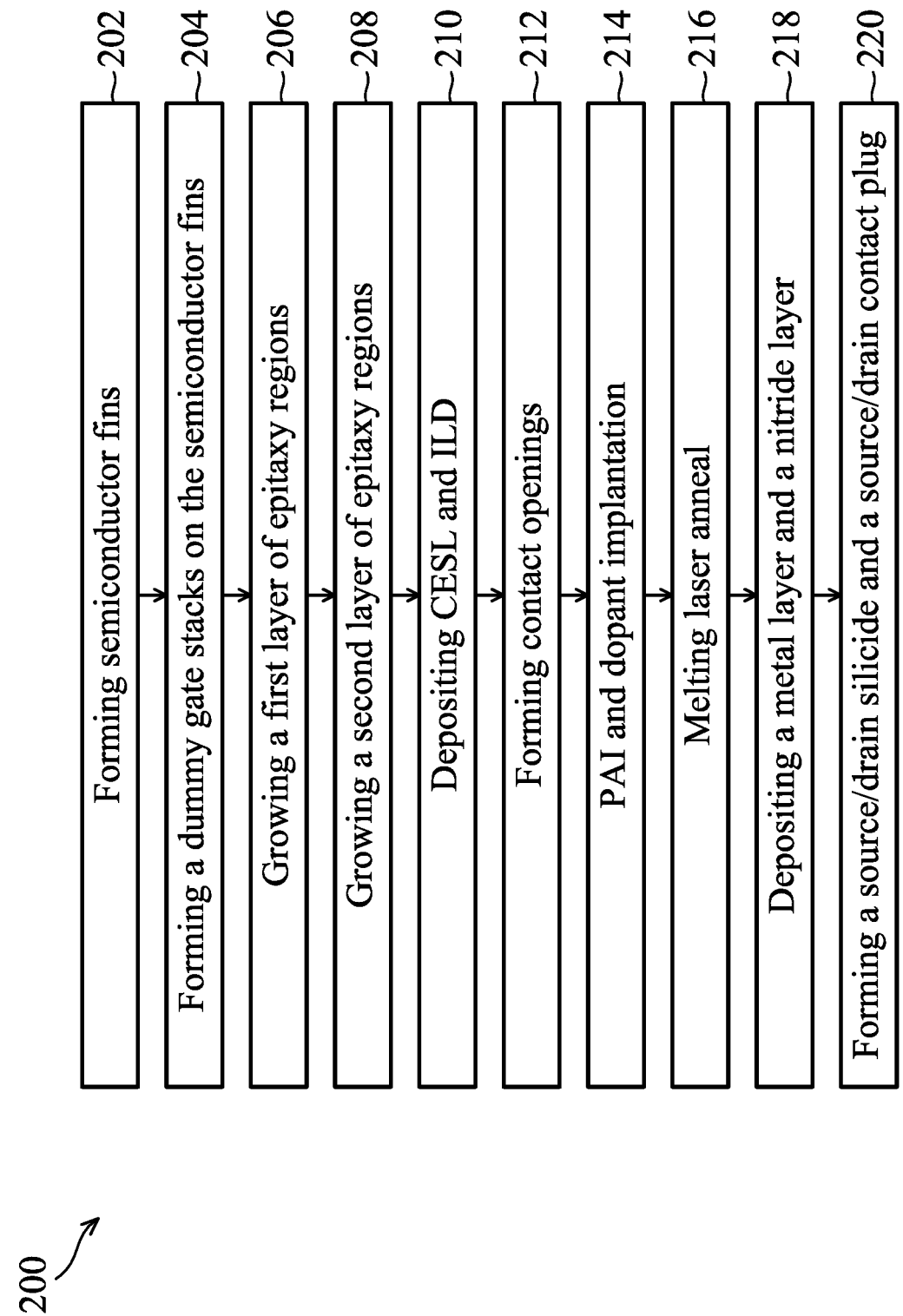
FIG. 19 illustrates a process flow for forming a FinFET in accordance with some embodiments.

FIGS. 1-4, 5A, 5B, 6A, 6B, 7, 8, 9A, 9B, 9C, 10, 11A, 11B, 11C, 12, 13A, 13B, 13C, and 14 illustrate the cross-sectional views and perspective views of intermediate stages in the formation of a FinFET in accordance with some embodiments of the present disclosure. The processes shown in these figures are also reflected schematically in the process flow 200 shown in FIG. 19.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
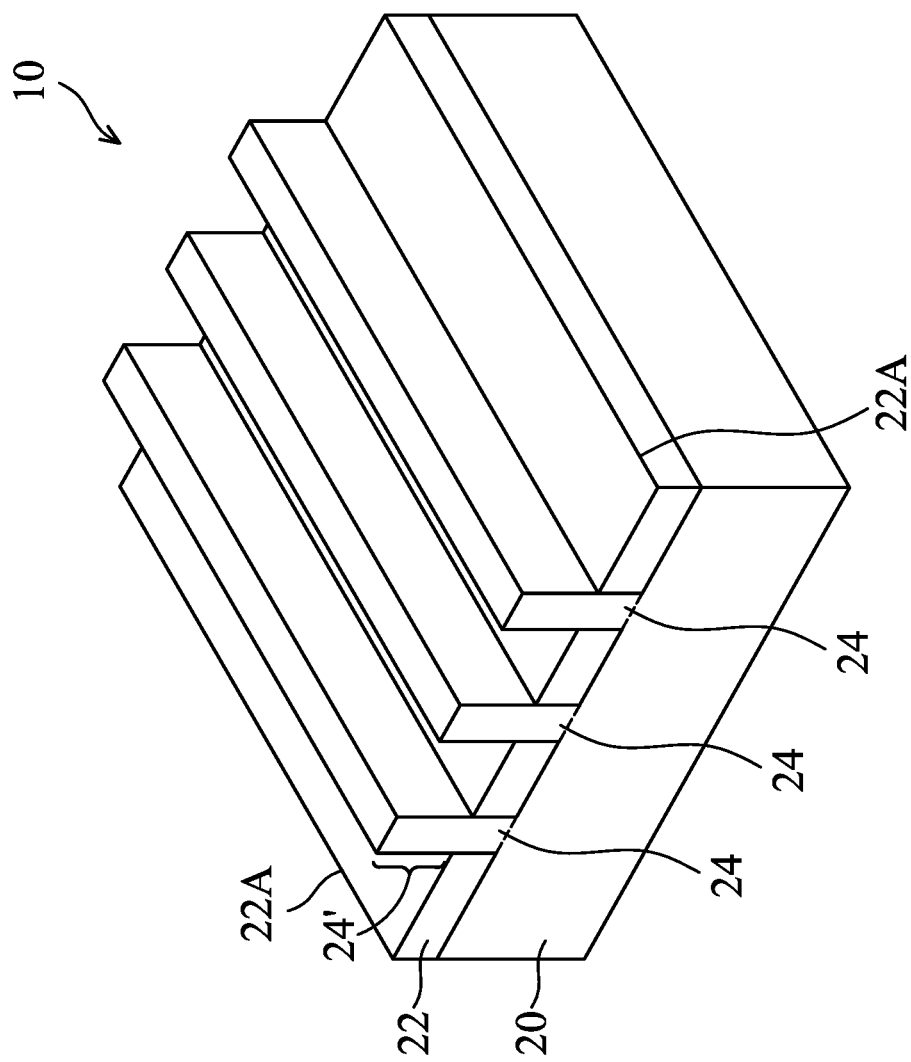

Referring to FIG. 2, STI regions 22 are recessed, so that the top portions of semiconductor strips 24 protrude higher than the top surfaces 22A of the remaining portions of STI regions 22 to form protruding semiconductor fins 24'. The respective process is illustrated as process 202 in the process flow 200 shown in FIG. 19. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
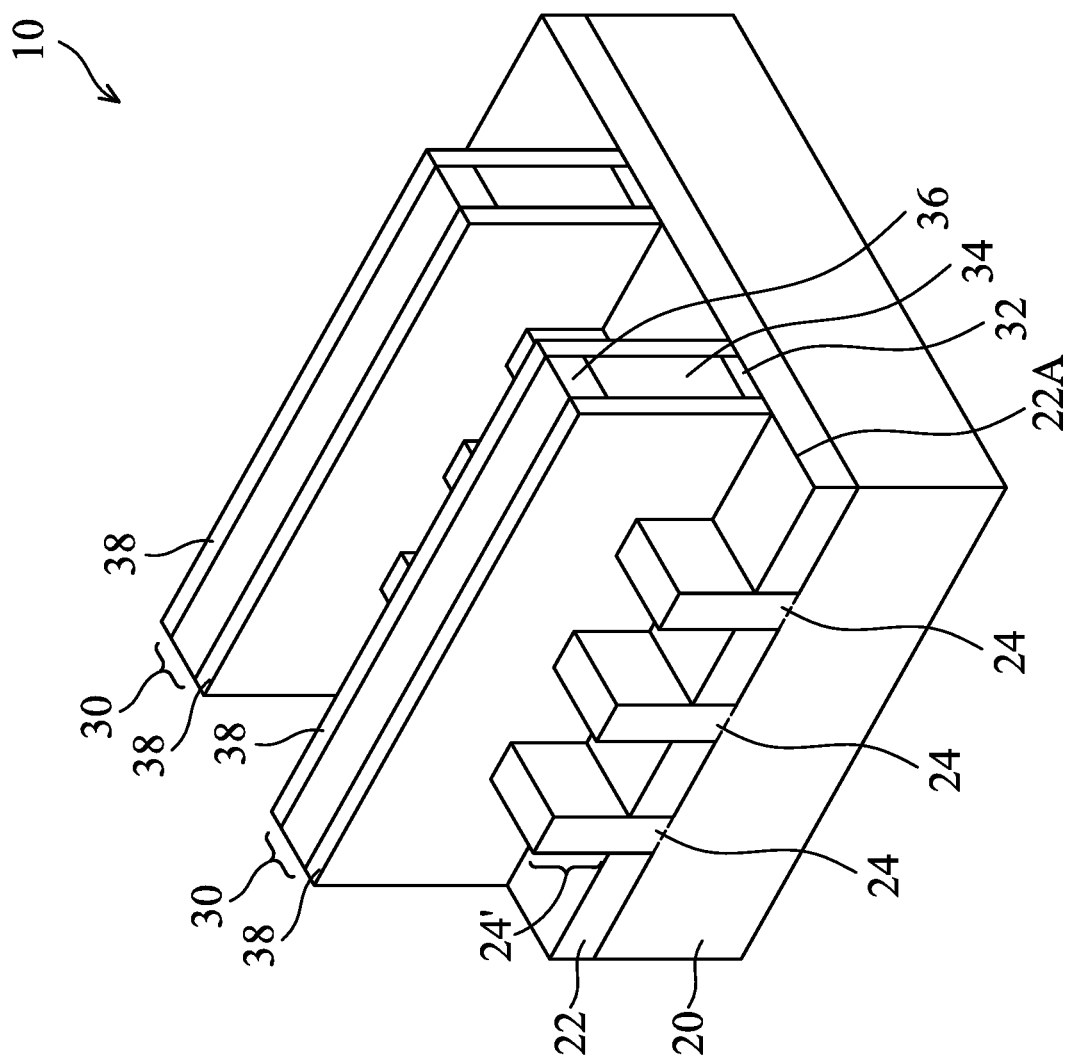

Referring to FIG. 3, dummy gate stack 30 is formed to extend on the top surfaces and the sidewalls of (protruding) fins 24'. The respective process is illustrated as process 204 in the process flow 200 shown in FIG. 19. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
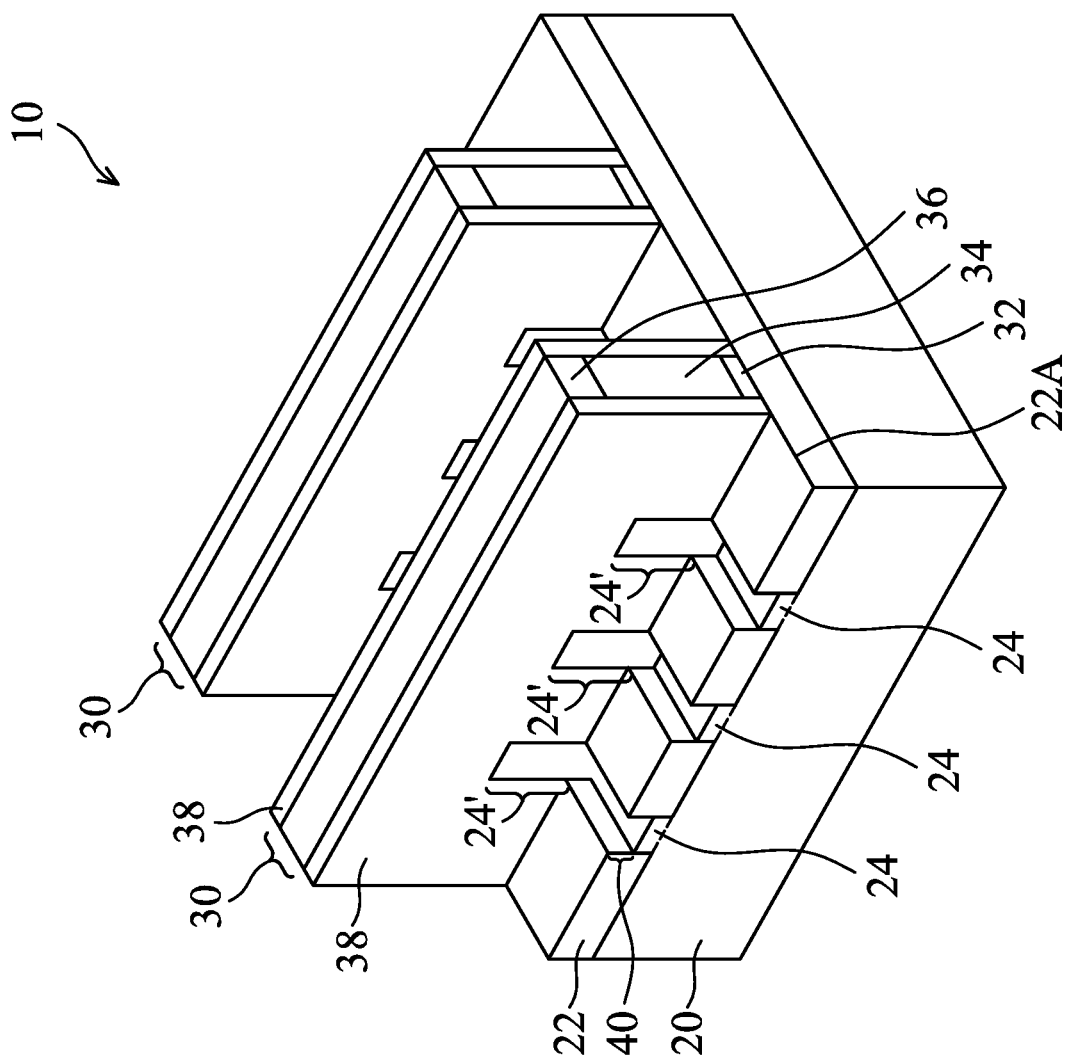

An etching step is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30, and include some portions lower than the top surfaces of STI regions 22, and some portions higher than the top surfaces of STI regions 22 and between neighboring gate stacks 30.

Figure 5A:
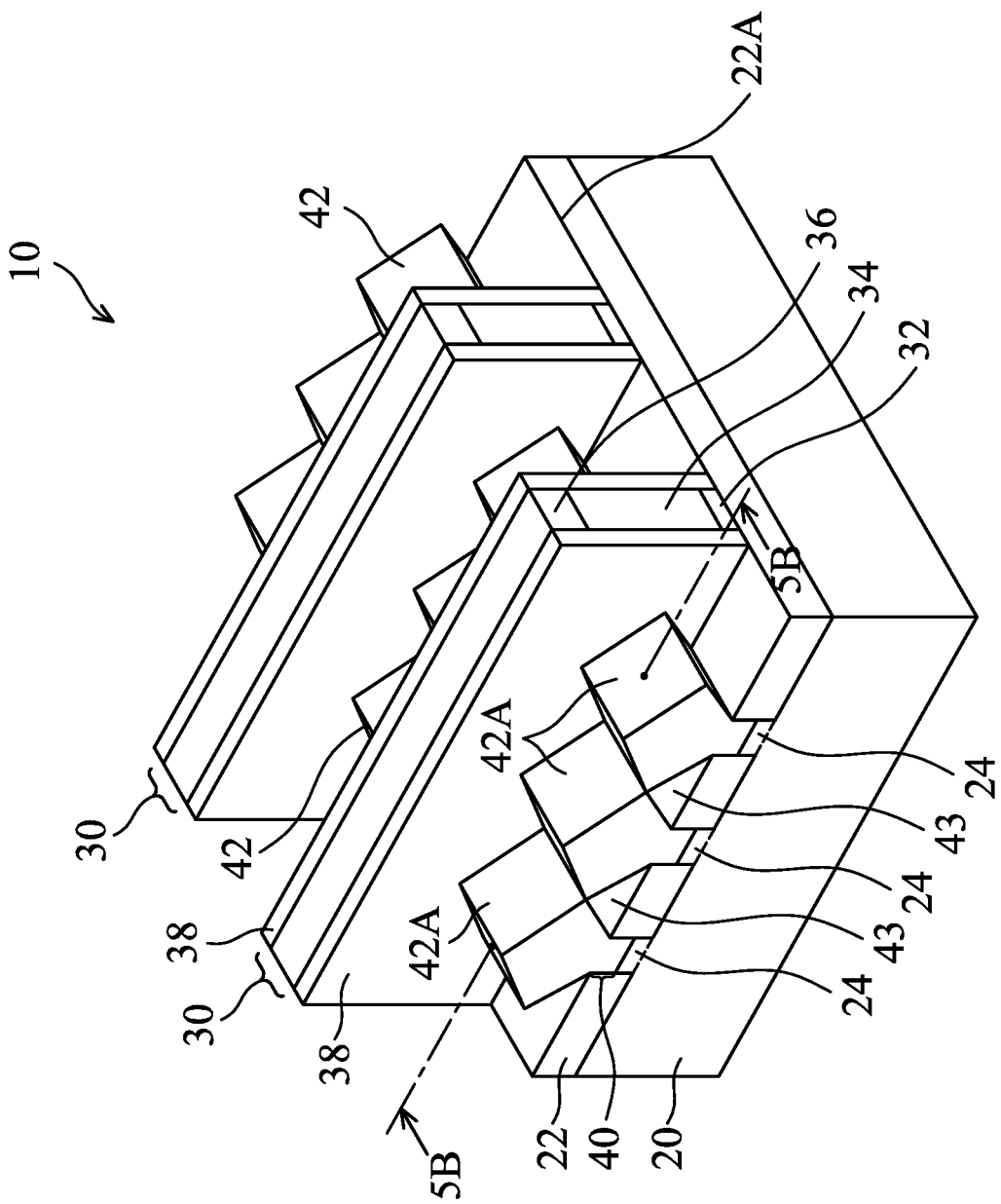

Next, a first epitaxy process is performed to form epitaxy portions 42A, which are selectively grown from recesses 40, resulting in the structure in FIG. 5A. The respective process is illustrated as process 206 in the process flow 200 shown in FIG. 19. In accordance with some embodiments, epitaxy portions 42A include silicon germanium or silicon. In accordance with some embodiments of the present disclosure, a p-type impurity such as boron or indium or gallium is in-situ doped into epitaxy portions 42A with the proceeding of the epitaxy. After epitaxy portions 42A fully fill recesses 40, epitaxy portions 42A start expanding horizontally, and facets may be formed. The neighboring epitaxy portions 42A start merging with each other. As a result, an integrated epitaxy region 42A is formed, with the top surface of the integrated epitaxy region 42A being wavy. Epitaxy portions 42A are sometimes referred to as, or may comprise, Layer 1 (L1) portions of the epitaxy regions 42 (FIG. 6A).

In accordance with some embodiments of the present disclosure, epitaxy portions 42A comprise silicon germanium with a first germanium atomic percentage, which may be in the range between about 0 percent and about 40 percent. The germanium percentage may be constant from the bottom to the top of epitaxy regions 42A, or may be gradient, which increases gradually from bottom to top.

Figure 5B:
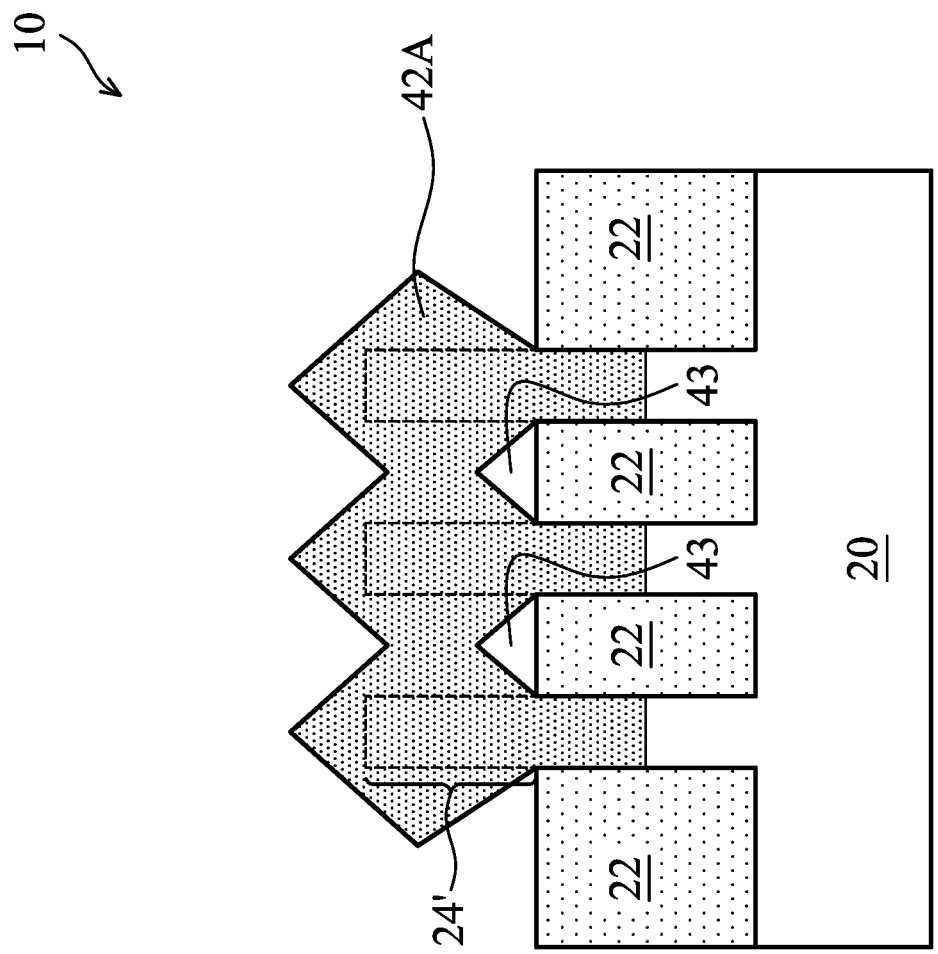

FIG. 5B illustrates a cross-sectional view of the structure shown in FIG. 5A, wherein the cross-sectional view is obtained from the vertical plane containing line 5B-5B in FIG. 5A. In FIG. 5B, the position of protruding fins 24', which is not in the illustrated plane, is shown using dashed lines to illustrate the relative positions of protruding fins 24' and epitaxy portions 42A in accordance with some embodiments.

Figure 6A:
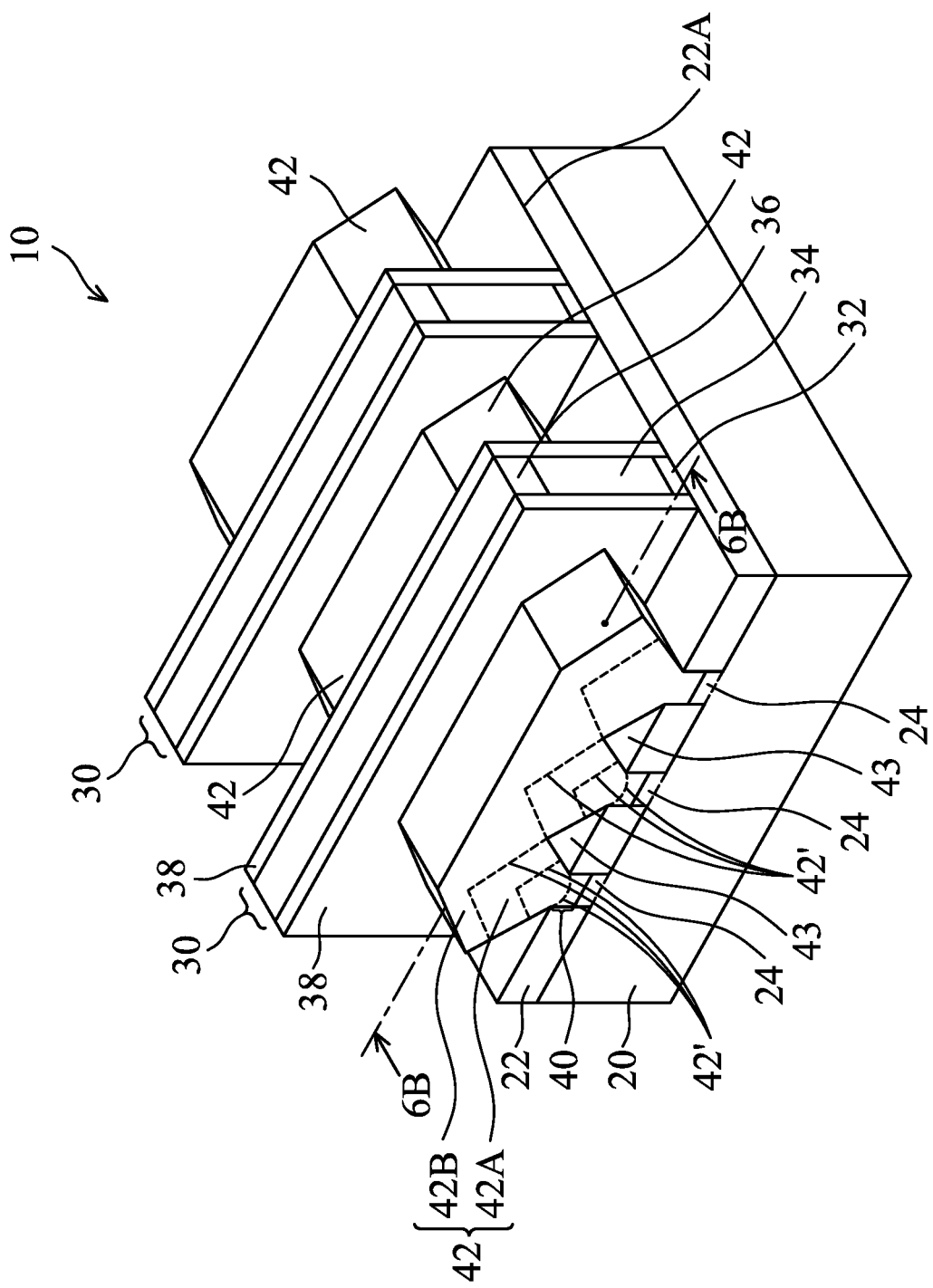
Figure 15:
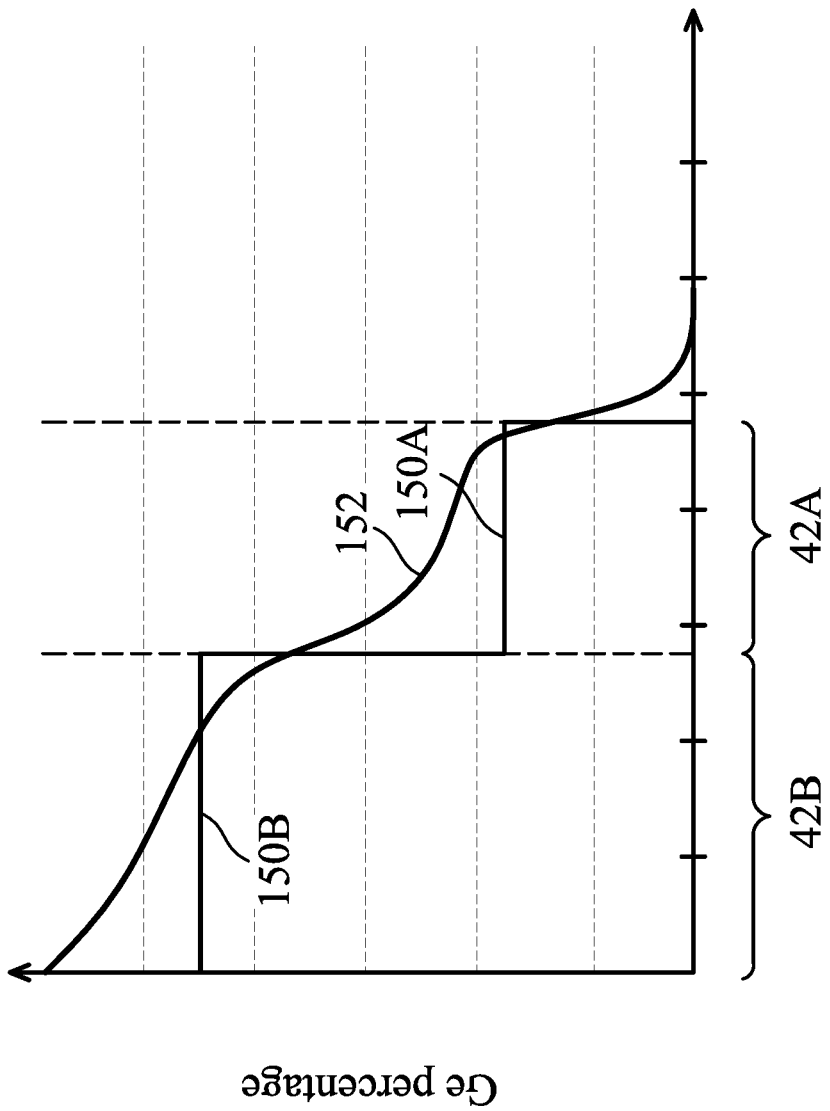
FIG. 15 illustrates the germanium atomic percentage as a function of depths in a silicon germanium region as deposited in accordance with some embodiments.

FIG. 6A illustrates the continued growth of epitaxy regions 42. The respective process is illustrated as process 208 in the process flow 200 shown in FIG. 19. Epitaxy regions 42 include upper portions 42B in addition to the lower portions 42A. Epitaxy regions 42B may comprise silicon germanium, and may or may not doped with a p-type impurity such as boron, indium, gallium, or the like during the epitaxy. Upper portions 42B are sometimes referred to as, or comprise, the Layer 2 (L2) portions of the epitaxy regions 42. The terms L1 and L2 are used to distinguish the portions of epitaxy regions 42 with lower germanium percentages and higher germanium percentages, respectively. It is appreciated that the interface between portions L1 and L2 may be lower than illustrated, for example, as shown by dashed lines 42' as examples. In accordance with some embodiments of the present disclosure, upper portions 42B have a second germanium percentage higher than the first germanium percentage of lower portions 42A. For example, the second germanium percentage may be in the range between about 40 percentage and about 65 percent. The difference between the atomic percentages of upper portions 42B and lower portions 42A may be higher than, for example, about 20 percent. The second germanium percentage may be constant from the bottom to the top of epitaxy regions 42B, or may be gradient, which increases gradually. In accordance with some embodiments, upper portions 42B includes first portions having gradient (and gradually increasing) germanium percentages (for example, gradually increase from about 30 percent to about 50 percent), and second portions over the first portions, with the second portions having a uniform germanium percentage (for example, between about 50 percent and about 60 percent). FIG. 15 illustrates an example of the percentages of epitaxy regions 42 in accordance with some embodiments of the present disclosure, wherein line 152 shows that epitaxy regions 42B have gradually increased germanium percentages, and line 150B shows that epitaxy regions 42B have a constant germanium percentage. The top surfaces of upper portions 42B may be planar as shown in FIG. 6A. Throughout the description, epitaxy regions 42 are alternatively referred to as source/drain regions 42.

Figure 6B:
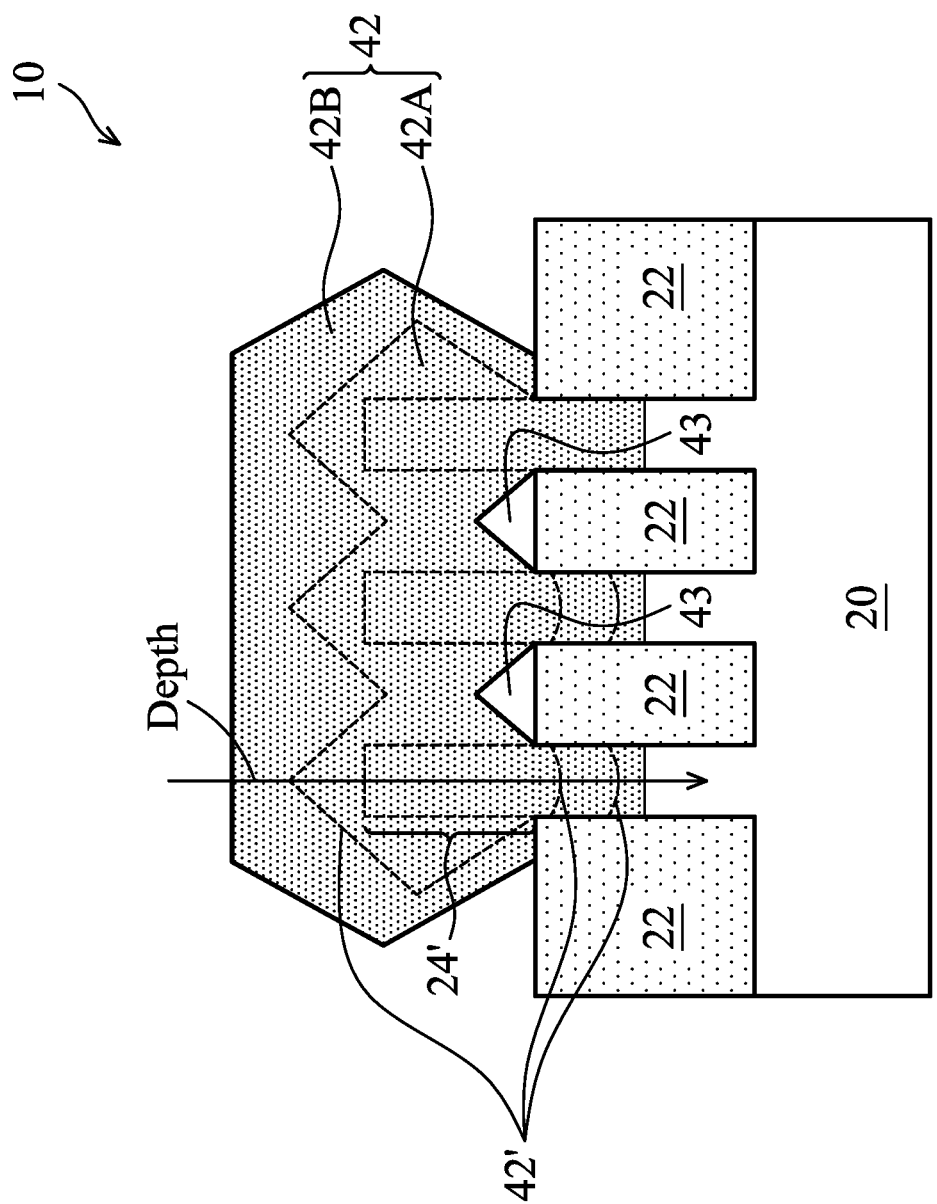

FIG. 6B illustrates a cross-sectional view of the structure shown in FIG. 6A, wherein the cross-sectional view is obtained from the vertical plane containing line 6B-6B in FIG. 6A. In accordance with some embodiments, layer L1 may be thin, while layer L2 may be much thicker than layer L1. Lines 42' represent some possible positions where layers L1 and the corresponding overlying layers L2 join, and the top surfaces of layer L1 may be at any position between the illustrated positions 42'.

FIG. 15 illustrates the examples of the germanium percentages in epitaxy regions 42 as a function of the depths of epitaxy regions 42. The depth is shown in FIG. 5B. The X-axis in FIG. 15 represents the depth into epitaxy regions 42, wherein the value of X-axis equal to zero correspond to the top surfaces of epitaxy regions 42 (FIG. 6B). In accordance with some embodiments of the present disclosure, the germanium percentage in epitaxy region 42 (as deposited without going through any subsequent anneal) is represented by lines 150A and 150B, which represent that the germanium in L1 and L2 have constant germanium atomic percentages. In accordance with alternatively embodiments of the present disclosure, the germanium percentage in epitaxy region 42 (as deposited without going any subsequent anneal) is represented by line 152, which shows that the upper portions of epitaxy regions 42 have gradually increased germanium percentages than the respective lower portions.

With the proceeding of the epitaxy, the epitaxy regions 42 grown from neighboring recesses merge with each other to form an integrated epitaxy region 42. Voids (air gaps) 43 (FIGS. 6A and 6B) may be generated. In accordance with some embodiments of the present disclosure, the formation of epitaxy region 42 is finished when the top surface of epitaxy regions 42 is still wavy. In accordance with other embodiments of the present disclosure, the formation of epitaxy region 42 is finished when the top surface of epitaxy regions 42 has become planar.

Figure 7:
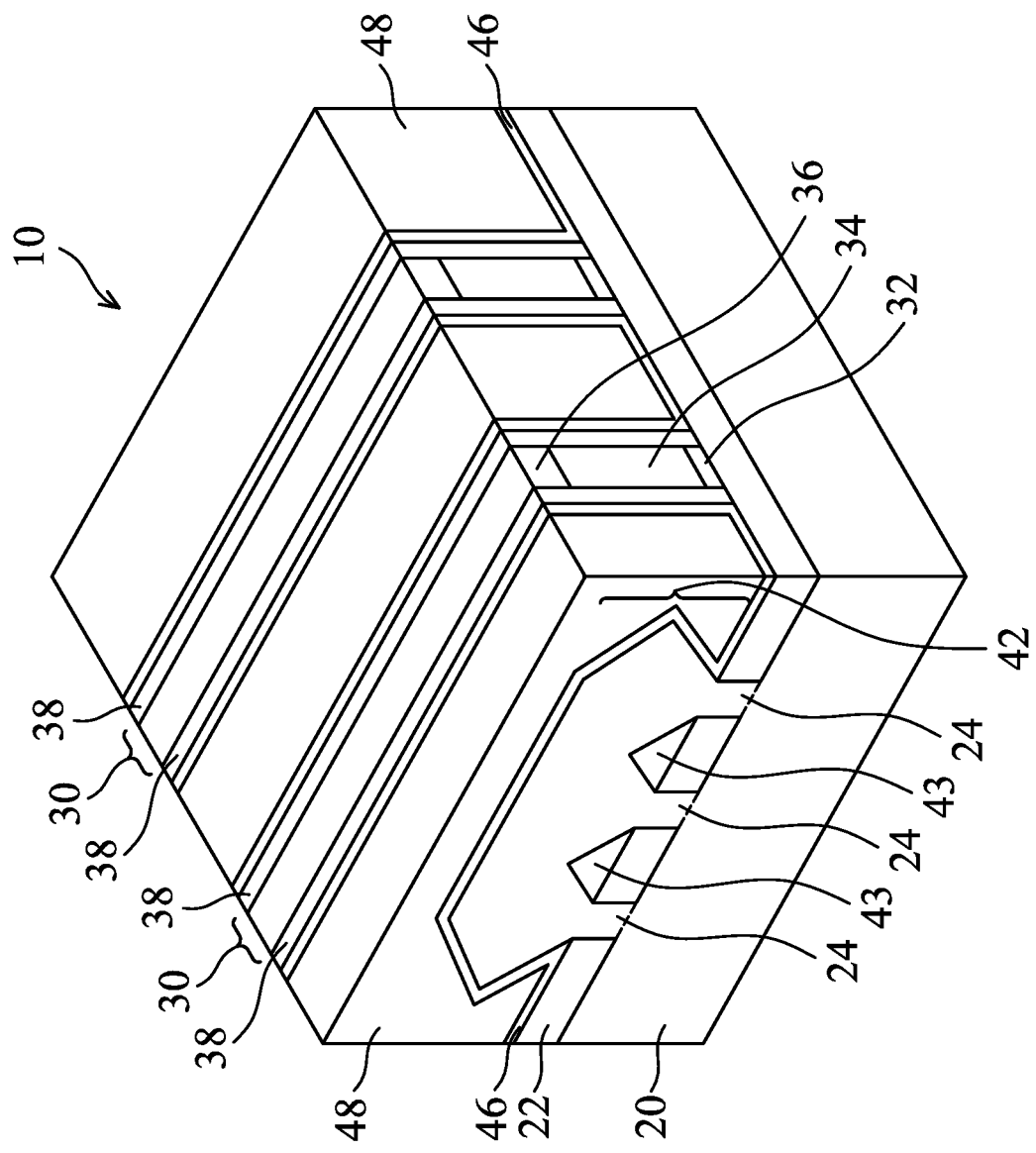

FIG. 7 illustrates a perspective view of the structure after the formation of Contact Etch Stop Layer (CESL) 46 and Inter-Layer Dielectric (ILD) 48. The respective process is illustrated as process 210 in the process flow 200 shown in FIG. 19. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition method. ILD 48 may be formed of an oxygen-containing dielectric material, which may be a silicon-oxide based material such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 8:
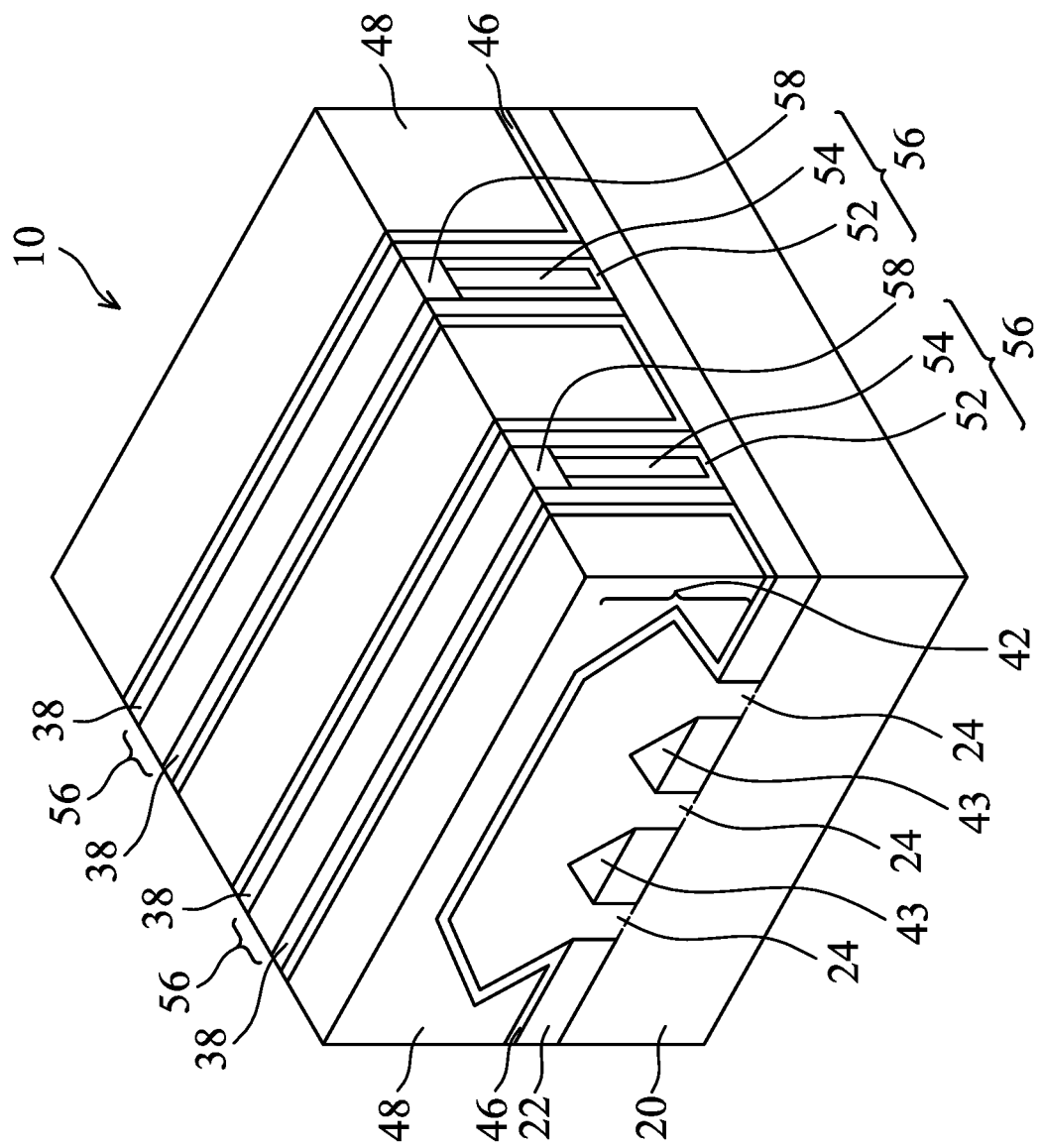

Next, dummy gate stacks 30, which include hard mask layers 36, dummy gate electrodes 34, and dummy gate dielectrics 32, are replaced with replacement gate stacks 56, which include metal gates 54 and gate dielectrics 52 as shown in FIG. 8. When forming replacement gate stacks 56, hard mask layers 36, dummy gate electrodes 34, and dummy gate dielectrics 32 as shown in FIG. 7 are first removed in one or a plurality of etching steps, resulting in trenches/openings to be formed between gate spacers 38. The top surfaces and the sidewalls of protruding semiconductor fins 24' are exposed to the resulting trenches.

Next, (replacement) gate dielectric layers 52 are formed, which extend into the trenches between gate spacers 38. In accordance with some embodiments of the present disclosure, each of gate dielectric layers 52 include an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectric layer 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIG. 8, gate electrodes 54 are formed over gate dielectrics 52, Gate electrodes 54 include conductive sub-layers. The sub-layers are not shown separately, while the sub-layers are distinguishable from each other. The deposition of the sub-layers may be performed using a conformal deposition method(s) such as ALD or CVD.

The stacked conductive layers may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to the requirement of the respective FinFET (such as p-type FinFET). For example, when the FinFET is a p-type FinFET, the work-function layer may include a TaN layer, a TiN layer over the TaN layer, and a TiAl layer over the TiN layer. After the deposition of the work-function layer(s), a barrier layer, which may be another TiN layer, is formed.

The deposited gate dielectric layers and conductive layers are formed as conformal layers extending into the trenches, and include some portions over ILD 48. Next, a metallic material is deposited to fill the remaining trenches between gate spacers 38. The metallic material may be formed of tungsten or cobalt, for example. In a subsequent step, a planarization step such as a CMP process or a mechanical grinding process is performed, so that the portions of the gate dielectric layers, conductive sub-layers, and the metallic material over ILD 48 are removed. As a result, metal gate electrodes 54 and gate dielectrics 52 are formed. Gate electrodes 54 and gate dielectrics 52 are in combination referred to as replacement gate stacks 56. The top surfaces of replacement gate stacks 56, gate spacers 38, CESL 46, and ILD 48 may be substantially coplanar at this time.

FIG. 8 also illustrates the formation of hard masks 58 in accordance with some embodiments. The formation of hard mask 58 may include performing an etching step to recess gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxynitride, silicon oxycarbo-nitride, or the like.

Figure 9A:
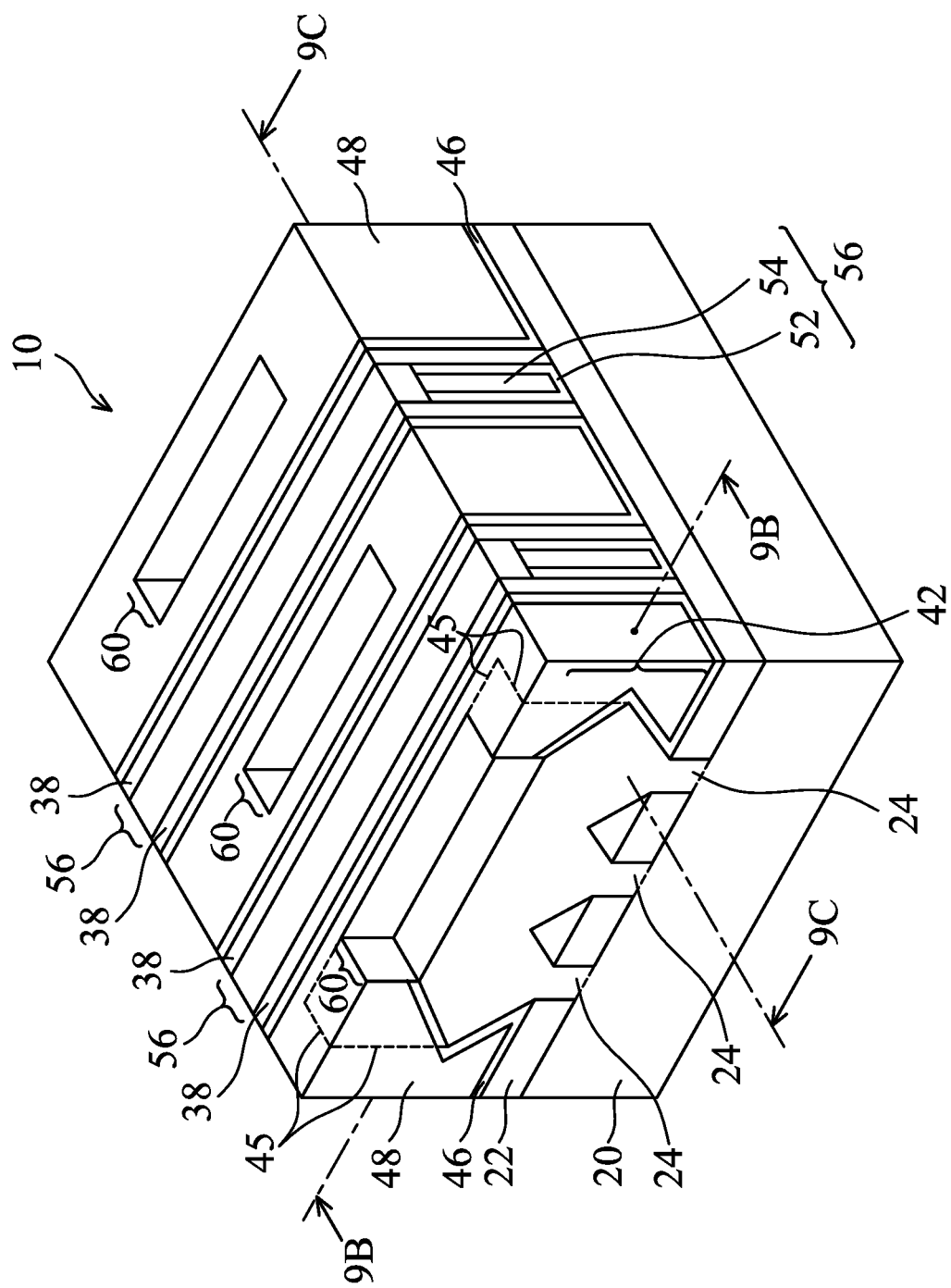

FIG. 9A illustrates the formation of contact openings 60. The respective process is illustrated as process 212 in the process flow 200 shown in FIG. 19. The formation of contact openings 60 include etching ILD 48 to expose the underlying portions of CESL 46, and then etching the exposed portions of CESL 46 to reveal epitaxy regions 42. In accordance with some embodiments of the present disclosure, as shown in FIG. 9A, the length of contact openings 60 is substantially equal to the length of the planar top surface of epitaxy regions 42. In accordance with other embodiments of the present disclosure, contact openings 60 are larger than illustrated, and may expand to the positions marked by dashed lines 45 or larger. As a result, the upper facets (and possibly lower facets) of epitaxy regions 42 may be revealed after the corresponding portions of CESL 46 are etched. Also, in accordance with some embodiments of the present disclosure, as illustrated in FIG. 9A, gate spacers 38 are spaced apart from nearest contact openings 60 by some remaining portions of ILD 48. In accordance with other embodiments, the sidewalls of gate spacers 38 are exposed to contact openings 60.

Figure 9B:
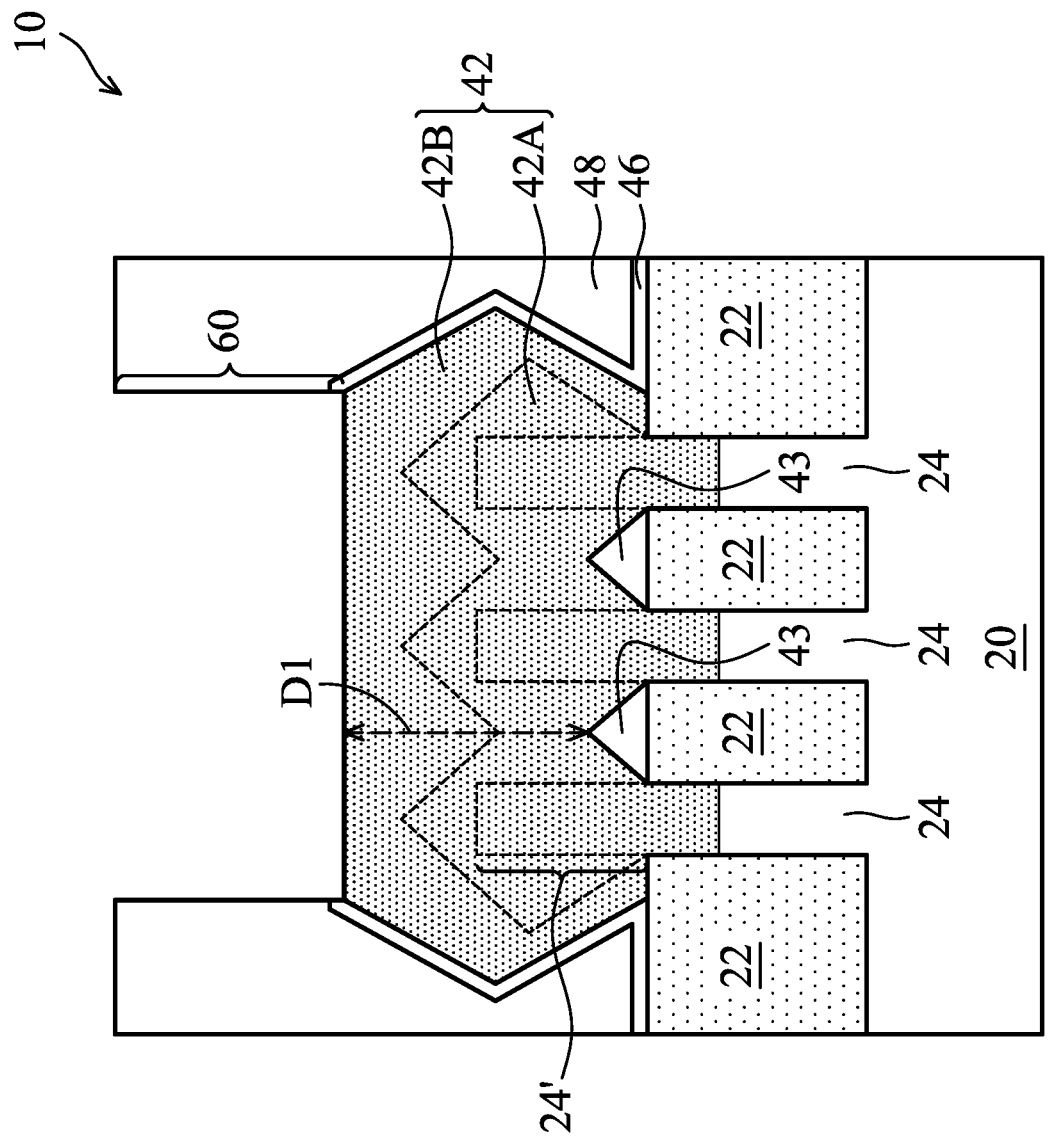
Figure 9C:
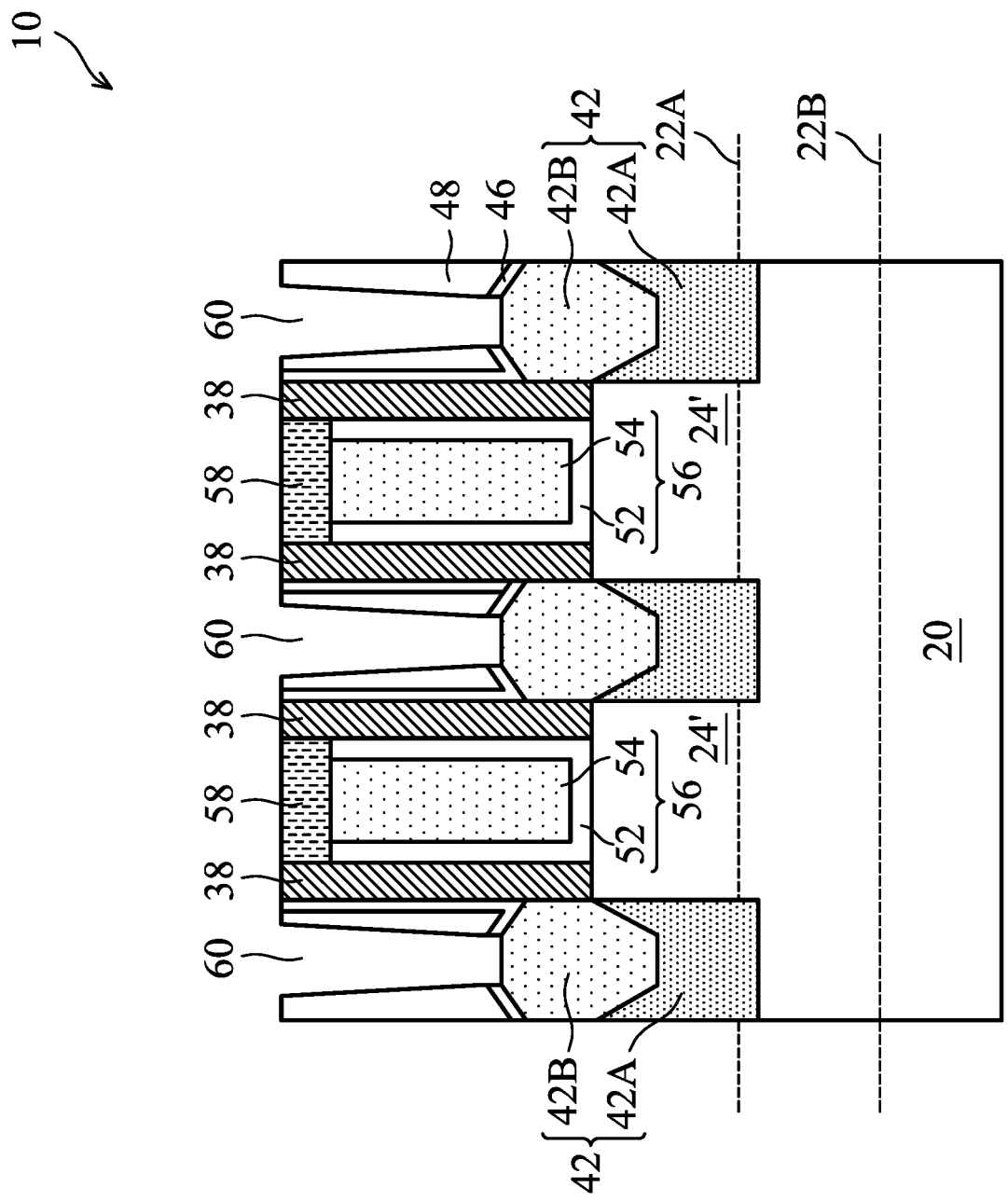

FIG. 9B illustrates a cross-sectional view of contact opening 60 obtained from the vertical plane containing line 9B-9B in FIG. 9A. FIG. 9C illustrates a cross-sectional view of contact opening 60 obtained from the vertical plane containing line 9C-9C in FIG. 9A. In FIG. 9C, the levels of the top surfaces 22A and bottom surfaces 22B of STI regions 22 are illustrated, and semiconductor fins 24' are over top surfaces 22A.

Figure 10:
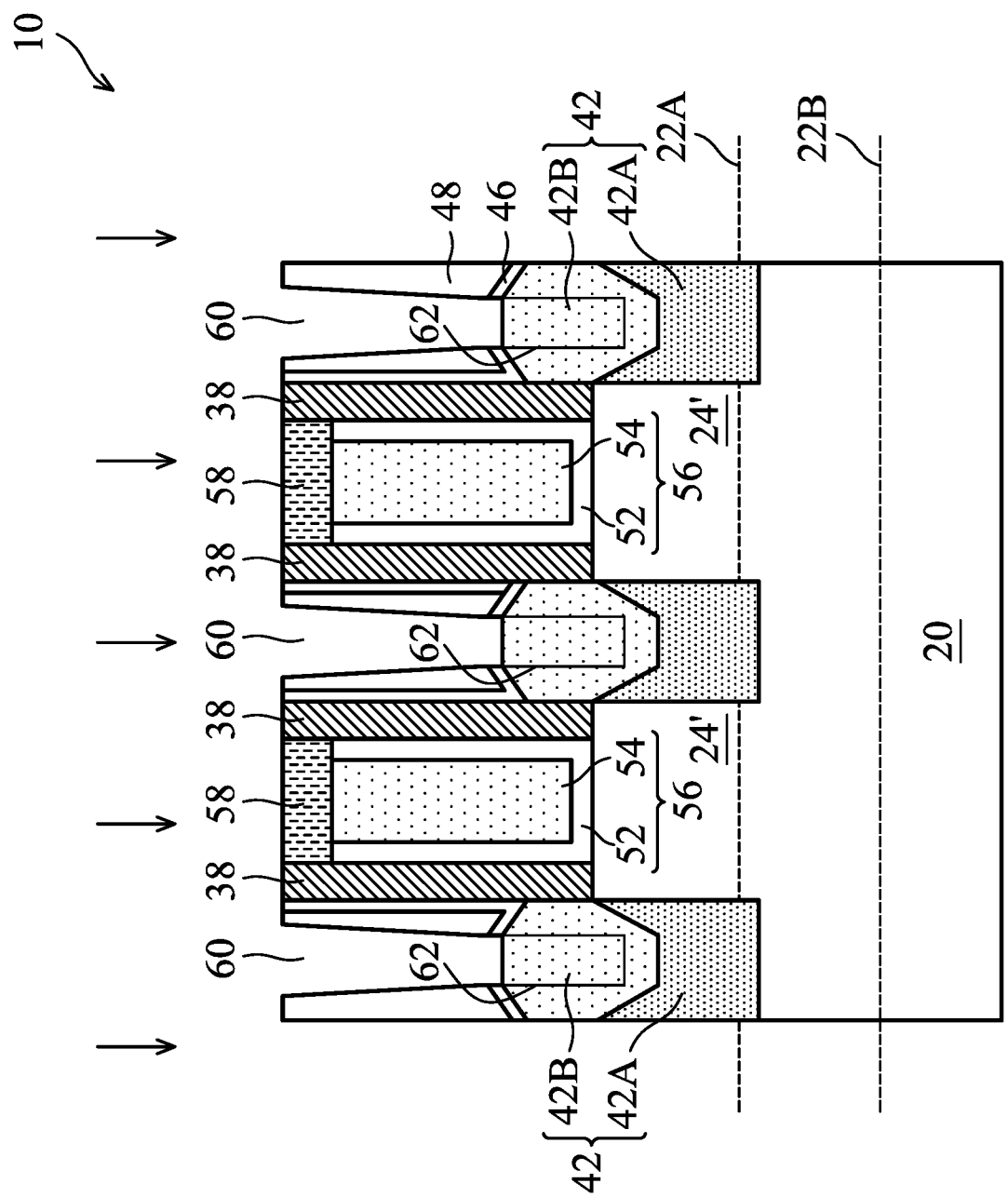

Referring to FIG. 10, a patterned mask (not shown) may be formed, which may be used to cover some device regions such as n-type FinFET regions, while leave some other portions such as the p-type FinFET regions exposed. A Pre-Amorphization Implantation (PAI, also sometimes referred to as pre-amorphous implantation) process is performed for forming PAI regions 62 in epitaxy regions 42. The respective process is illustrated as process 214 in the process flow 200 shown in FIG. 19. In accordance with some embodiments, silicon or germanium is implanted. In accordance with other embodiments, an inert specie such as neon, argon, xenon, and radon is implanted. The bottom of the implanted regions 62 may be higher than the top ends of air gaps 43 (FIG. 9B). Furthermore, the bottoms of the implanted regions 62 may be at a level higher than about $2/3$ of the depth D1 (FIG. 9B) of air gaps 43. PAI regions 62 may be in epitaxy portions 42B and do not extend into epitaxy portions 42A. Alternatively, PAI regions 62 may extend slightly into epitaxy portions 42A. The lattice structure of the implanted regions is destructed by the PAI, and PAI regions 62 are converted into amorphous regions.

Next, a p-type impurity (dopant) implantation may be performed. The respective process is also illustrated as process 214 in the process flow 200 shown in FIG. 19. For example, boron, gallium, and/or indium may be implanted. In accordance with alternative embodiments, the processes of forming the patterned mask, the PAI, and the p-type impurity (dopant) implantation are skipped.

Figure 11A:
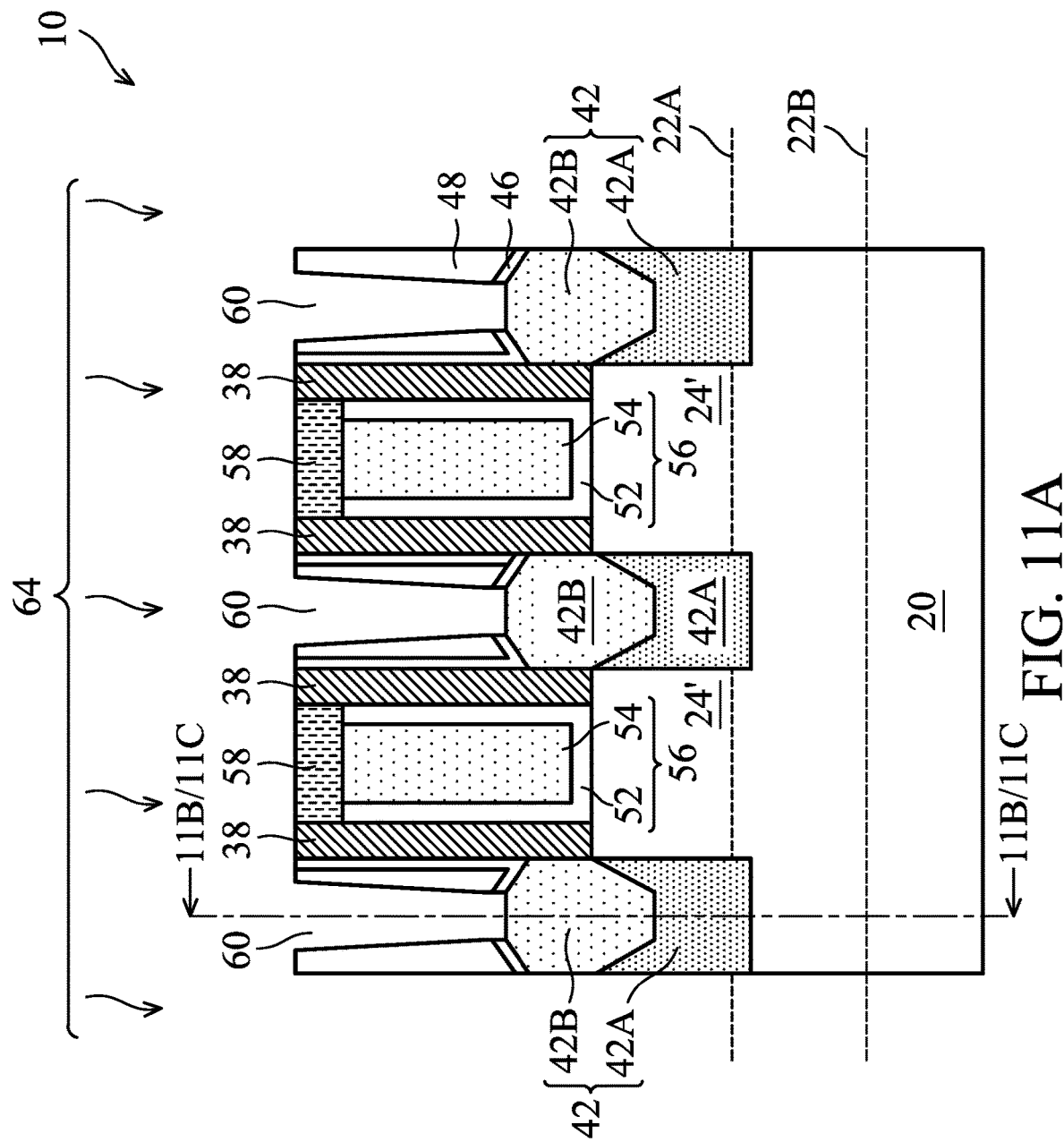

FIG. 11A illustrates an anneal process, as represented by arrows 64. The respective process is illustrated as process 216 in the process flow 200 shown in FIG. 19. In accordance with some embodiments, the anneal process includes a melting laser anneal process. In the melting laser anneal process, at least some portions of epitaxy regions 42 are molten or only the surface portion is molten. The anneal process, in addition to the melting laser anneal process, may or may not include other non-melting anneal processes such as, and not limited to, a millisecond anneal process, which may be performed using laser, UV light, flash lamp, etc. In the non-melting anneal processes, no portion of epitaxy regions 42 is molten. The non-melting anneal processes have the effect of activating the dopants in the non-melted portions of the source/drain regions in addition to the molten portions of the source/drain regions. Through the melting laser anneal process, the PAI regions 62 are re-crystallized.

Figure 11B:
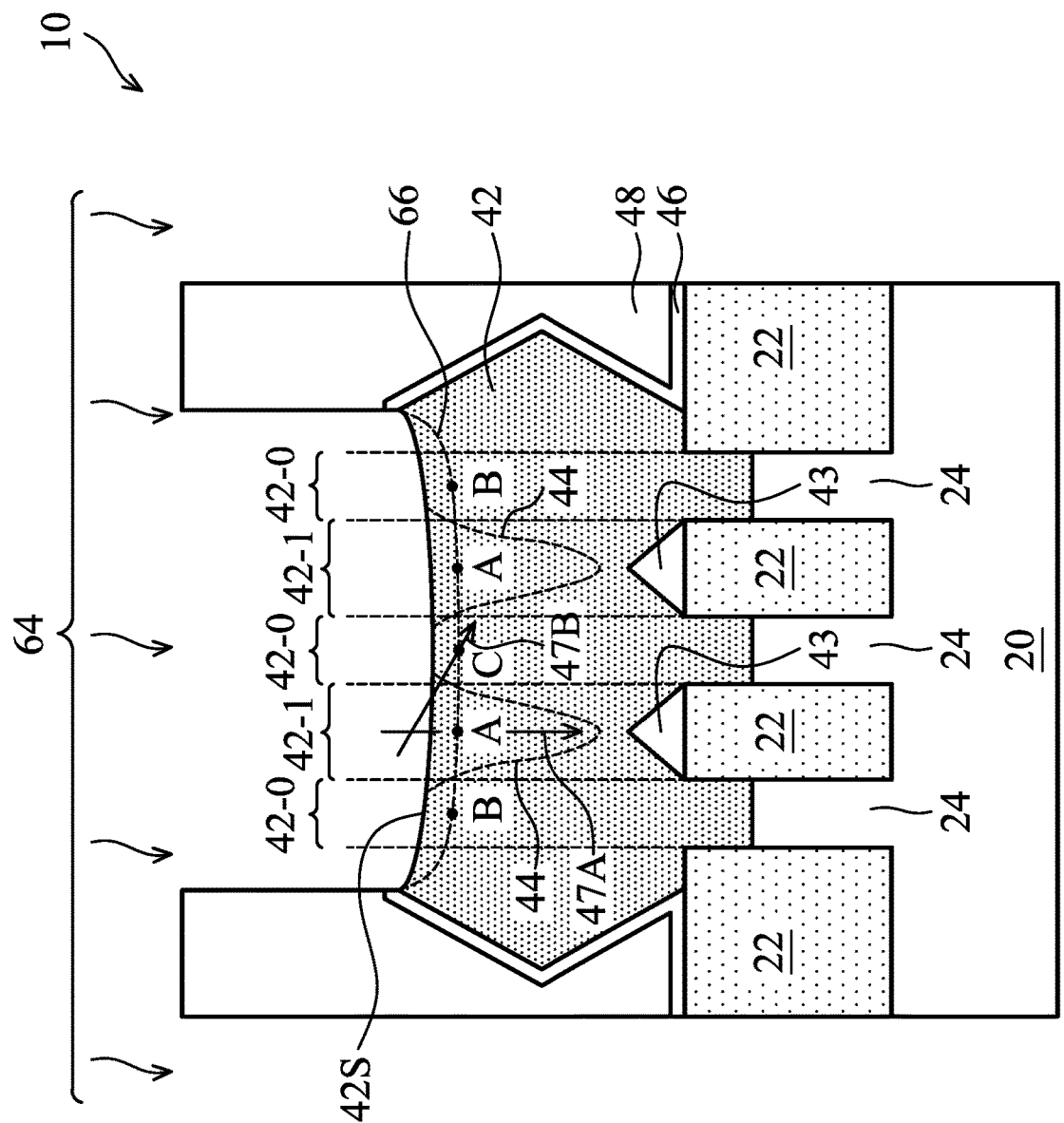

FIG. 11B illustrates the reference cross-section 11B/11C-11B/11C in FIG. 11A. Due to that the germanium concentration at the surface of epitaxy regions 42 is high, the surface portions of epitaxy regions 42 are prone to the oxidation due to the oxygen in air and the oxidant in the chemicals of the cleaning processes. As a result, the top surface 42S of epitaxy region 42 is recessed, and may be continuously curved and continuously rounded.

In accordance with some embodiments of the present disclosure, the melting laser anneal is performed by projecting a laser beam on the portions of wafer 10 to be annealed. When a laser beam is used, the laser beam may have the size of one die or a plurality of dies, or may have the size of an entire wafer, and a laser pulse is generated so that the entire die, the plurality of dies, or the entire wafer is annealed simultaneously. The size of the laser beam may also be a fraction (such as a quarter, a third, a half, etc.) of a device die. In which case, a device die is annealed through several laser pulses that in combination cover the entire die. The duration of the laser pulse may be in the range between about 10 nanoseconds and about 1 microsecond. The laser beam may also be small, and the laser anneal is performed by scanning the wafer using the laser beam. In accordance with some embodiments of the present disclosure, the laser source has polarization function so that the laser beam is polarized (with the corresponding electrical field either parallel to or perpendicular to the incident plane of the laser beam). The laser source may also have pre-heat function to raise the temperature of the annealed source/drain regions from room temperature to a sub-melt temperature (for example, about 700° C.-900° C.). The pre-heating is performed prior to melting the source/drain regions. The preheating can also be performed by annealing the wafers using the laser beam projected through a plurality of projections, each in an incident angle different from other incident angles of the plurality of projections, so that the energy and the resulting melting depths and region can be controlled.

In accordance with some embodiments of the present disclosure, the power and the duration of the melting laser anneal is adjusted, so that some upper portions (discussed in detail in subsequent paragraphs) of epitaxy regions 42 are molten, and some lower portions are not molten. Since there may be air gaps 43 (FIG. 9B), if the lower portions of source/drain regions 42 exposed to air gaps 43 are molten, epitaxy regions 42 may undesirably collapse into air gaps 43, and hence it is desirable that at least a part of the source/drain regions 42 is not molten.

The melting point of silicon germanium is related to the atomic percentage of germanium in epitaxy regions 42, and the higher the germanium percentage is, the lower the melting point will be. For example, silicon has the melting point of 1,415° C., and germanium has the melting point of 937° C. The melting point of silicon germanium may be in the range between about 937° C. and about 1,415° C., depending on the atomic percentage of germanium. Since the lower portions of epitaxy regions 42 may have a lower germanium percentage than the respective upper portions, their melting point is higher than the melting point of the corresponding upper portions. Therefore, by adjusting the power and laser duration, the temperature of the annealed portions may be selected to be higher than the melting point of the portions that are not intended to be molten, and lower than the melting point of the portions that are intended to be molten to cause some portions to be molten, and some other portions not molten, as will be discussed in subsequent paragraphs.

In addition, the amorphized regions 62 have a lower melting point than that of the un-amorphized portions of epitaxy regions 42. The melting laser anneal may thus be controlled so that the temperature is higher than the melting point of PAI regions 62 and lower than the melting point of the un-amorphized portions of epitaxy regions 42, so that PAI regions 62 are molten, while the un-amorphized portions of source/drain regions 42 are not molten. Accordingly, the depth of amorphized regions 62 is adjusted (for example, smaller than 100 percent or ⅔ of depth D1 in FIG. 9B) to control the melting depth to be smaller than depth D1.

As shown in FIG. 11B, epitaxy regions 42 includes regions (portions) 42-O and 42-I. Regions 42-O are "on-fin" regions, which overlap semiconductor strips 24. Regions 42-I are "Intra-fin" regions, which are between on-fin regions 42-O. Intra-fins 42-I may overlap air gaps 43. After the melting laser anneal, heat dissipates down in to wafer 10, so that the molten portions solidify. Since air gaps 43 have lower thermal conductivity values than semiconductor strips 24, the heat in intra-fin regions 42-I has a slower dissipation rate than the heat in on-fin regions 42-O. As a result, after the melting laser anneal, on-fin regions 42-O are solidified earlier than intra-fin regions 42-I. The solidification may proceed from the on-fin regions 42-O to intra-fin regions 42-I, and from the lower portions to the upper portions of epitaxy regions 42.

Germanium has a higher solubility in molten silicon germanium than in solid silicon germanium. Accordingly, germanium tends to be concentrated from solid or sub-molten (which means partially molten with a higher viscosity) silicon germanium into the molten silicon germanium. As a result, germanium migrates (concentrates) from the surface portion of the solidified silicon germanium into the molten portions, and from the (molten and then solidified) on-fin regions 42-O to the (molten and then solidified) intra-fin regions 42-I. Regions 44 thus have higher germanium percentages than the neighboring regions after the melting laser anneal. Regions 44 are mostly in intra-fin regions 42-I, and may extend to some upper portions of on-fin regions 42-O. Furthermore, in regions 44, the upper portions may have higher germanium atomic percentages than the respective lower portions.

In accordance with some embodiments of the present disclosure, the melting laser anneal is performed through a single-shot laser anneal, in which a single laser shot (pulse) is performed, and then the molten region is solidified. In accordance with alternative embodiments of the present disclosure, the melting laser anneal is performed through a multi-shot laser anneal, in which 2, 3, 4, or more (for example, up to about 9) laser shots are performed before or after the molten region is allowed to be fully solidified. The interval between laser shots may be shorter than about 1 second, and may be shorter than about 0.1 second. or even less than the laser pulse duration, so that when a subsequent shot is performed, the molten region has not been solidified yet. Experiment results indicate that the number of shots may affect the sheet resistance of the annealed region, which may be due to the better re-crystallization to eliminate defects when more shot are performed. When the energy of each shot is low, for example, lower than about 1.3 J/cm$^2$, with each shot, the sheet resistance may be reduced over the previous shots. When the energy of each shot is high, for example, higher than about 1.3 J/cm$^2$, more shots do not result in the further reduction of the sheet resistance, and a single shot melting laser anneal is performed.

In accordance with some embodiments, the energy of the laser shots is in the range between about 0.2 J/cm$^2$ and about 1.8 J/cm$^2$. In accordance with some embodiments, multi-shots are performed using energies smaller than about 1.3 J/cm$^2$ and may be between about 0.2 J/cm$^2$ and about 1.3 J/cm$^2$. Low energy (such as lower than about 1 J/cm$^2$) may be used to control the molten regions to be not too deep, and multiple shots are used to compensate for the inadequate melting due to the lower energy, and to adequately melt the shallow portions of epitaxy regions 42.

As shown in FIG. 11B, dashed line 66 represents the future interface between source/drain silicide region 72 (FIG. 13A) and the underlying un-silicided portions of source/drain regions 42. The top portions of source/drain regions 42 will be silicided in the subsequent silicidation process, and dashed line 66 will be the future top surface of source/drain regions 42. Points A, B, and C are illustrated. Point A is in line 66, and is aligned to the middle (vertical) line between two neighboring semiconductor strips 24. Points B and C are on the opposite sides of point A, and are vertically aligned to the middle (vertical) lines of semiconductor strips 24. Due to the concentrating of germanium caused by the melting laser anneal, the germanium atomic percentage at point A may be increased by more than about 10 percent, more than about 20 percent, or more. For example, before the melting laser anneal, the germanium atomic percentage at point A may be in the range between about 30 percent and about 60 percent, and after the melting laser anneal, the germanium atomic percentage at point A may be in the range between about 50 percent and about 90 percent. On the other hand, in accordance with some embodiments, at points B and C, the germanium atomic percentages may be substantially the same before and after the melting laser anneal, or may be increased. For example, the increase of germanium atomic percentage at points B and C may be in the range between 0 percent and about 10 percent. In accordance with some embodiments, before the melting laser anneal, the germanium atomic percentages at points B and C may be in the range between about 30 percent and about 60 percent, and after the melting laser anneal, the germanium atomic percentages at points B and C may be in the range between about 30 percent and about 70 percent. The magnitude of the increase at points B and C, however, is smaller than the increase at point A. Furthermore, before the melting laser anneal, the germanium atomic percentages at points A, B, and C may be substantially equal to each other, for example, with a difference smaller than about 5 atomic percent, while after the melting laser anneal, the difference may be greater than about 10 atomic percent, and may be of any value in the range between about 10 atomic percent and about 50 atomic percent.

Figure 16:
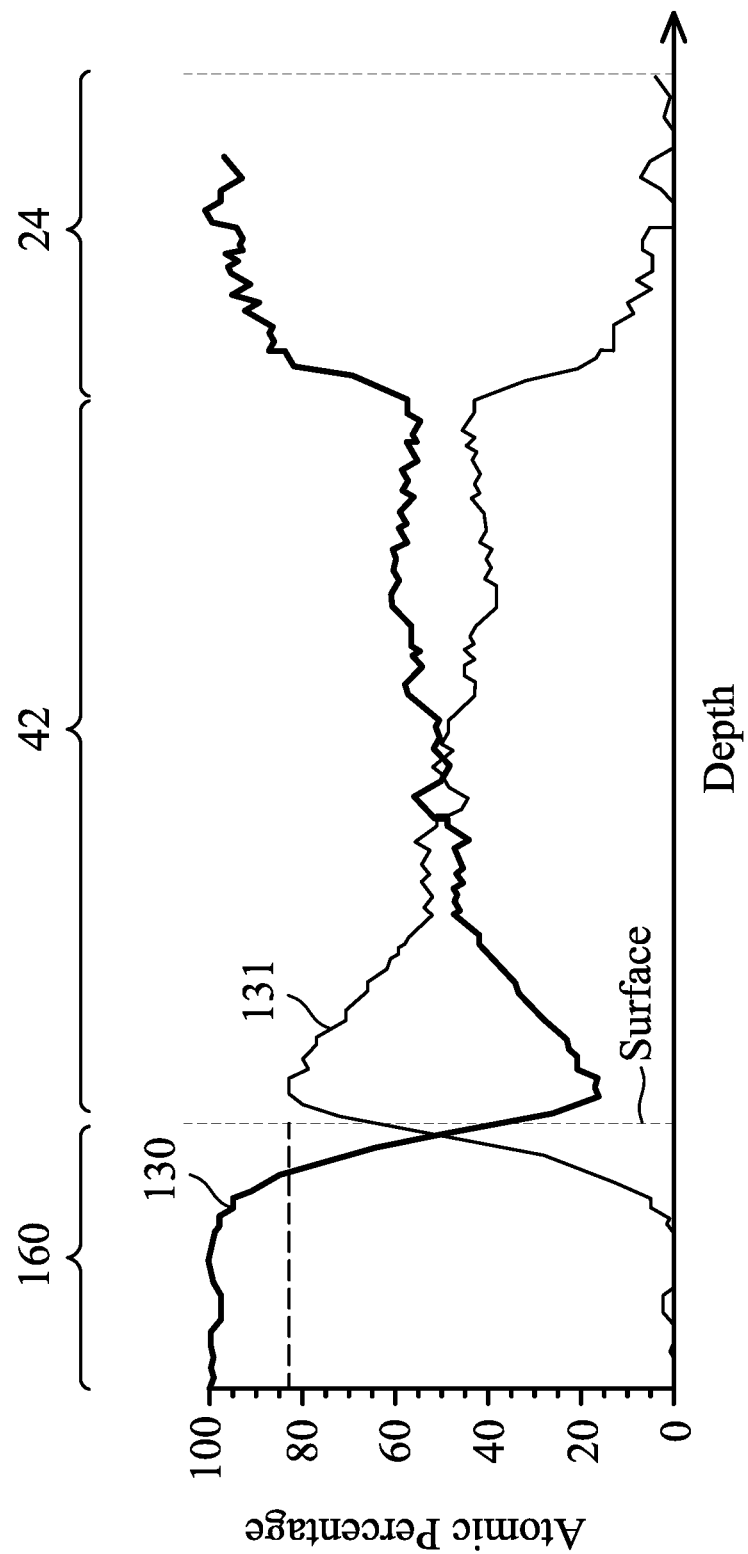
FIG. 16 illustrates the silicon atomic percentage and germanium atomic percentage as functions of depths in a vertical direction in accordance with some embodiments.
Figure 17:
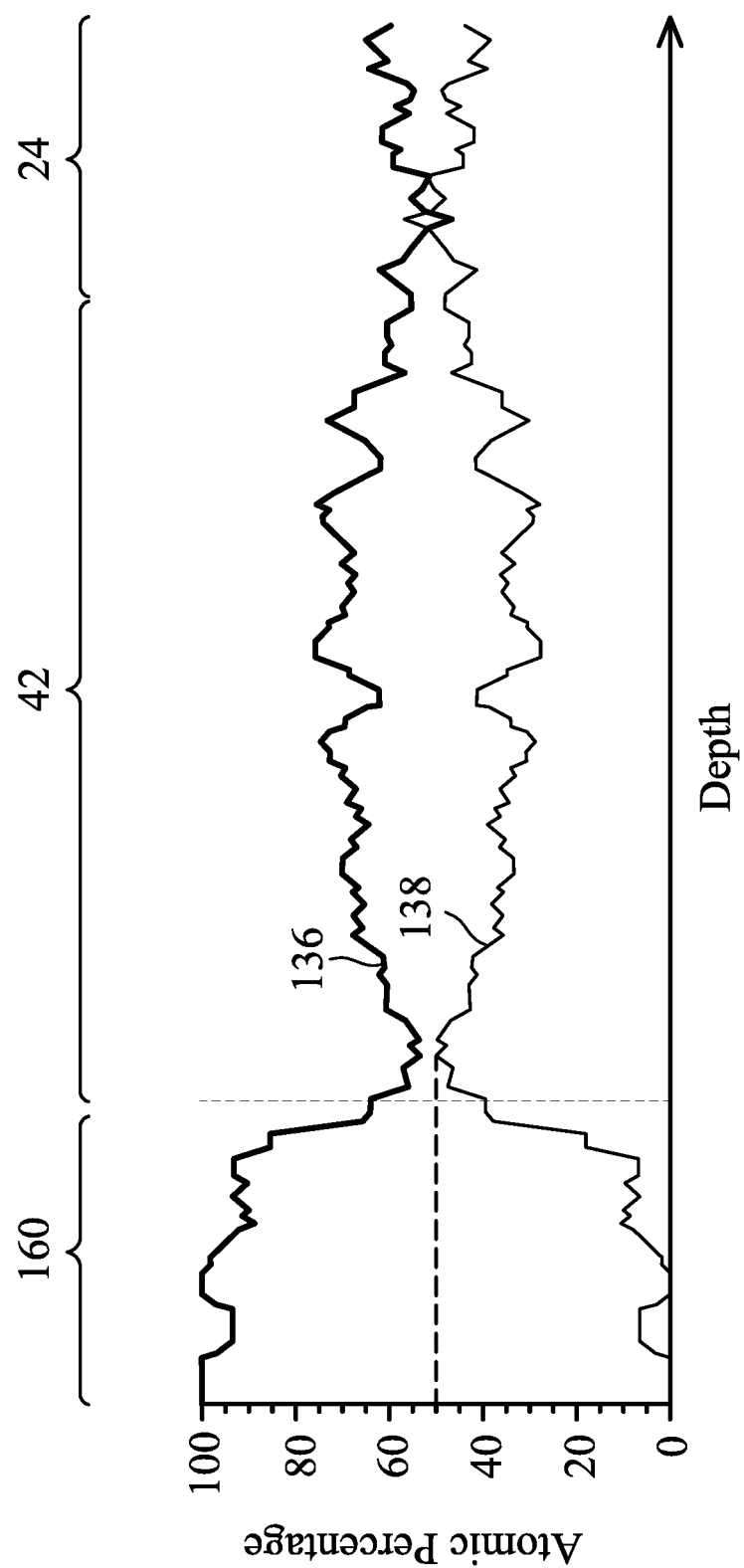
FIG. 17 illustrates the silicon atomic percentage and germanium atomic percentage as functions of depths in a tilted direction in accordance with some embodiments.

FIGS. 16 and 17 illustrate the difference of germanium atomic percentages in intra-fin regions 42-I and on-fin regions 42-O. FIG. 16 illustrates the atomic percentages of silicon and germanium measured in the direction represented by arrow 47A in FIG. 11B, which arrow 47A is aligned to the middle line of the intra-fin region 42-I. The measured sample has spin-on glass (SOG), which includes silicon oxide, over epitaxy region 42. Line 130 and line 132 in FIG. 16 are the atomic percentages of silicon and germanium (without counting other elements such as oxygen), respectively. The region 160 represents the SOG region, and epitaxy region 42 and semiconductor strip 24 are also marked. As is shown in FIG. 16, close to the top surface of epitaxy region 42, which is also close to the point A in FIG. 11B, the germanium concentration is significantly increased due to the concentrating caused by the melting laser anneal. In the illustrated sample, the peak germanium percentage reaches about 80 percent. The germanium atomic percentage reduces when going deeper into epitaxy region 42, and the drop rate depends on the depth of the molten region.

FIG. 17 illustrates the atomic percentages of silicon and germanium measured in the direction represented by arrow 47B in FIG. 11B. SOG region 162, epitaxy region 42, and semiconductor strip 24 are also marked. Line 136 and line 138 are the atomic percentages of silicon and germanium (without counting other elements such as oxygen), respectively. As is shown in FIG. 17, in the direction of arrow 47B (FIG. 11B), the increase of germanium concentration is much smaller than in direction 47A (FIG. 11B). In the illustrated sample, the peak germanium percentage is about 43 percent, which is close to the germanium atomic percentage before the melting laser anneal.

Figure 11C:
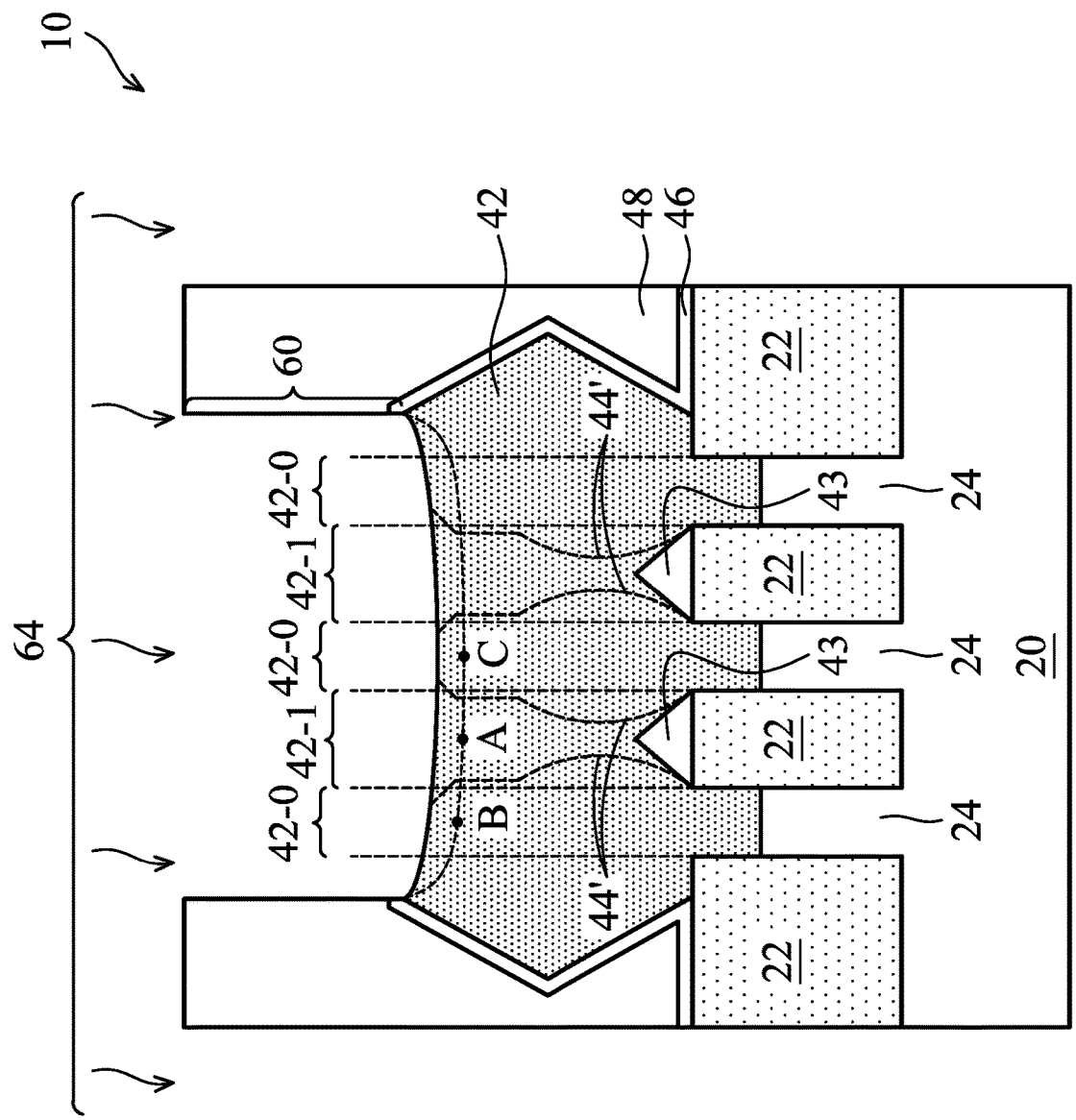

In accordance with some embodiments, the molten region is relatively shallow, as shown in FIG. 11B, and hence the germanium-concentrated region (in which germanium increases significantly, for example, more than about 10 percent) is as the dashed region 44. In which embodiments, the molten region is shallower. FIG. 11C illustrates the embodiment when the molten region is larger than what is shown in FIG. 11B, in which the germanium-concentrated regions 44' extend to air gaps 43. Since the molting duration is very short, the molten regions may or may not collapse into air gaps 43. Furthermore, the portion of the molten regions directly exposed to air gaps 43 may be sub-molten to prevent the collapse.

Figure 12:
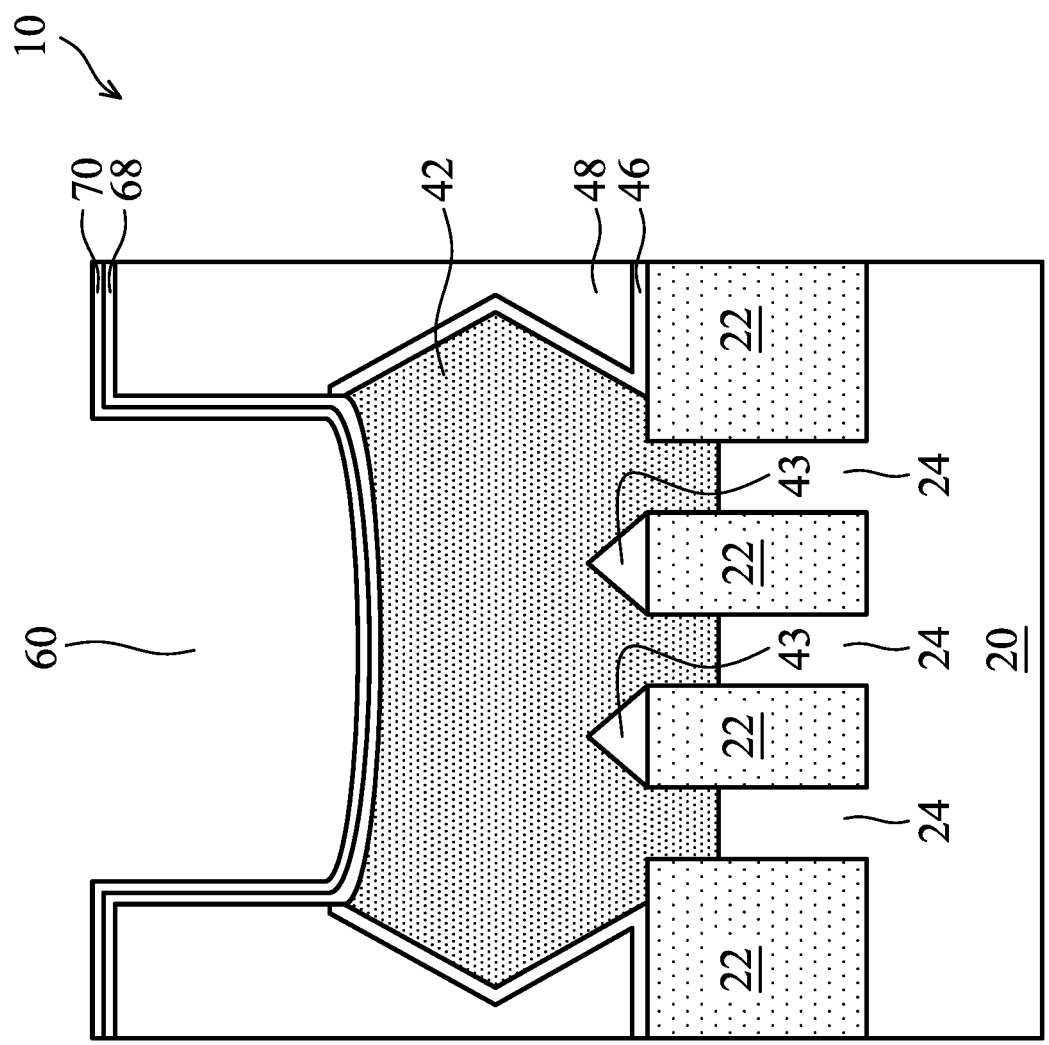

Referring to FIG. 12, metal layer 68 and metal nitride layer 70 are deposited, for example, using conformal deposition processes. The respective process is illustrated as process 218 in the process flow 200 shown in FIG. 19. In accordance with some embodiments, metal layer 68 is a titanium layer. Metal nitride layer 70 may be a titanium nitride layer, and may be formed using ALD, CVD, or the like. Metal nitride layer 70 may also be formed by nitridating the top portion of metal layer 68, and leaving the bottom portion of metal layer 68 not nitridated.

Figure 13A:
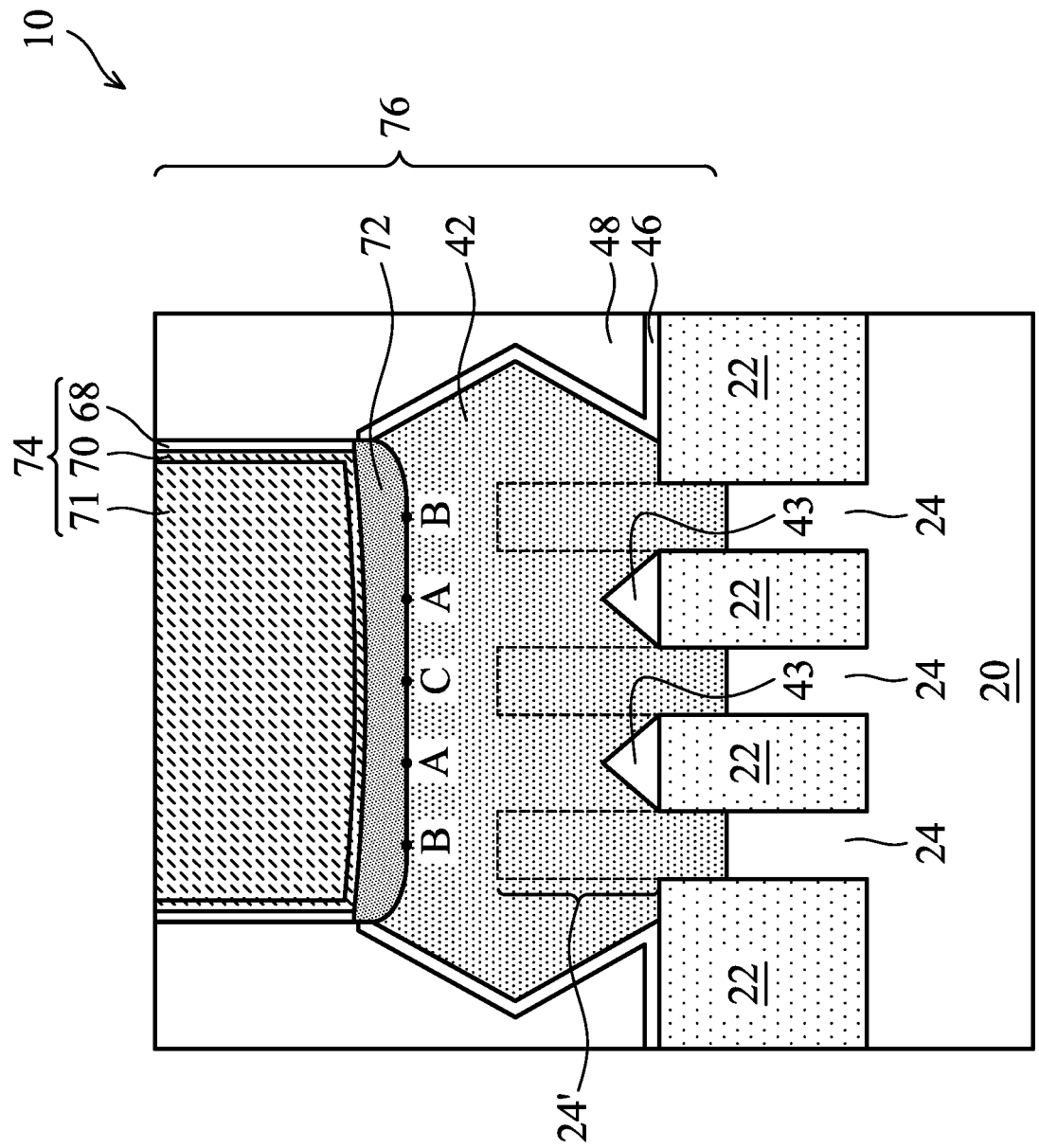

Next, an anneal (which may be rapid thermal anneal) is performed to react metal layer 68 with the top portion of source/drain regions 42 to form silicide region 72, as shown in FIG. 13A. Silicide region 72 forms curved top surface 42S' with the underlying source/drain region 42. The respective process is illustrated as process 220 in the process flow 200 shown in FIG. 19. The portions of metal layer 68 on the sidewalls of ILD 48 are not reacted. Next, either the previously formed metal nitride layer 70 is left as not removed, or the previously formed metal nitride layer 70 is removed, followed by the deposition of a new metal nitride layer (such as titanium nitride layer) that is thinner than the removed metal nitride layer. A metallic material 71 such as tungsten, cobalt, or the like, is then filled into contact openings 60, followed by a planarization to remove excess materials, resulting in source/drain contact plug 74. Accordingly, source/drain contact plug 74 includes the remaining portions of metal layer 68, metal nitride layer 70, and metallic material 71.

Figure 13B:
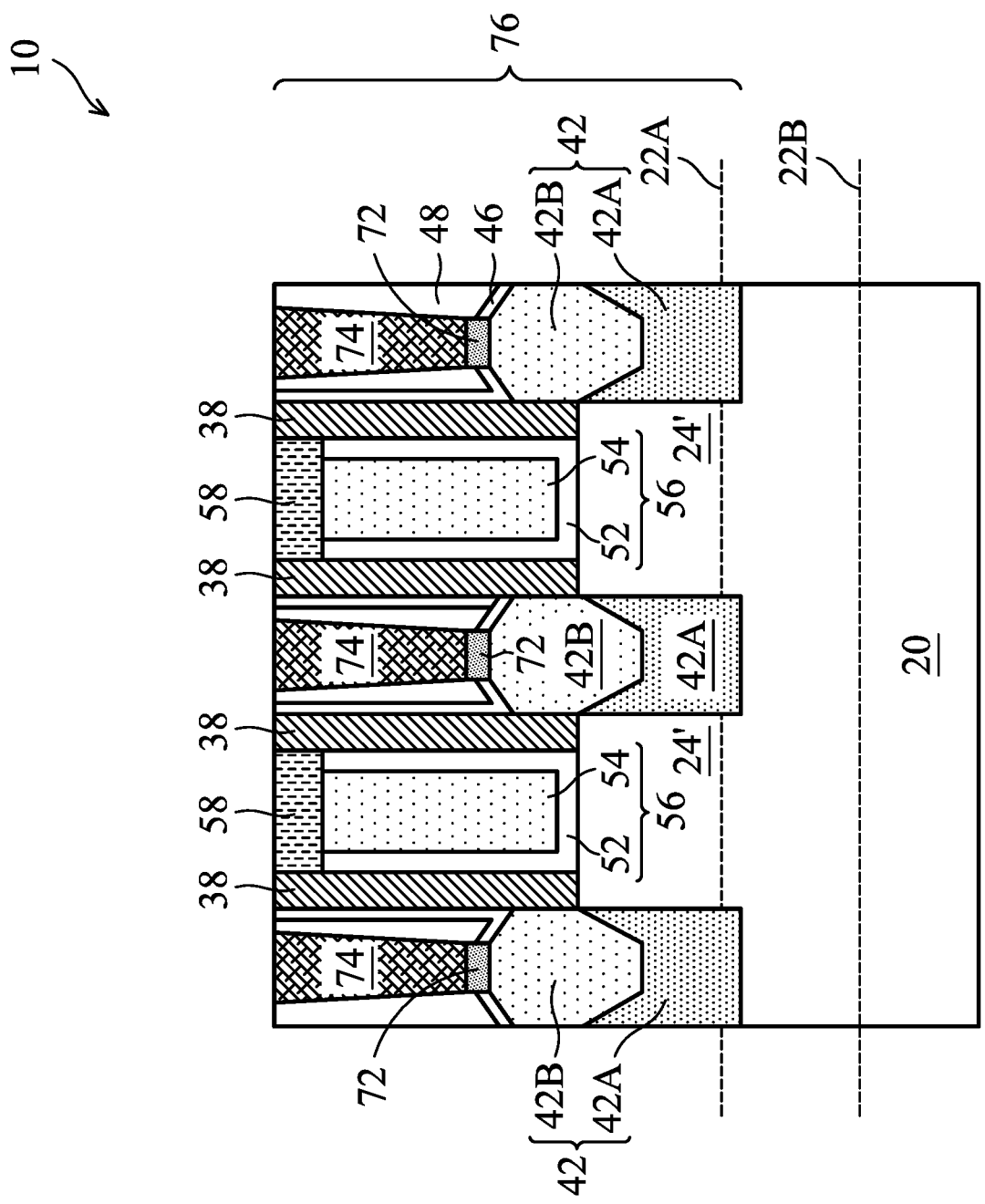
Figure 13C:
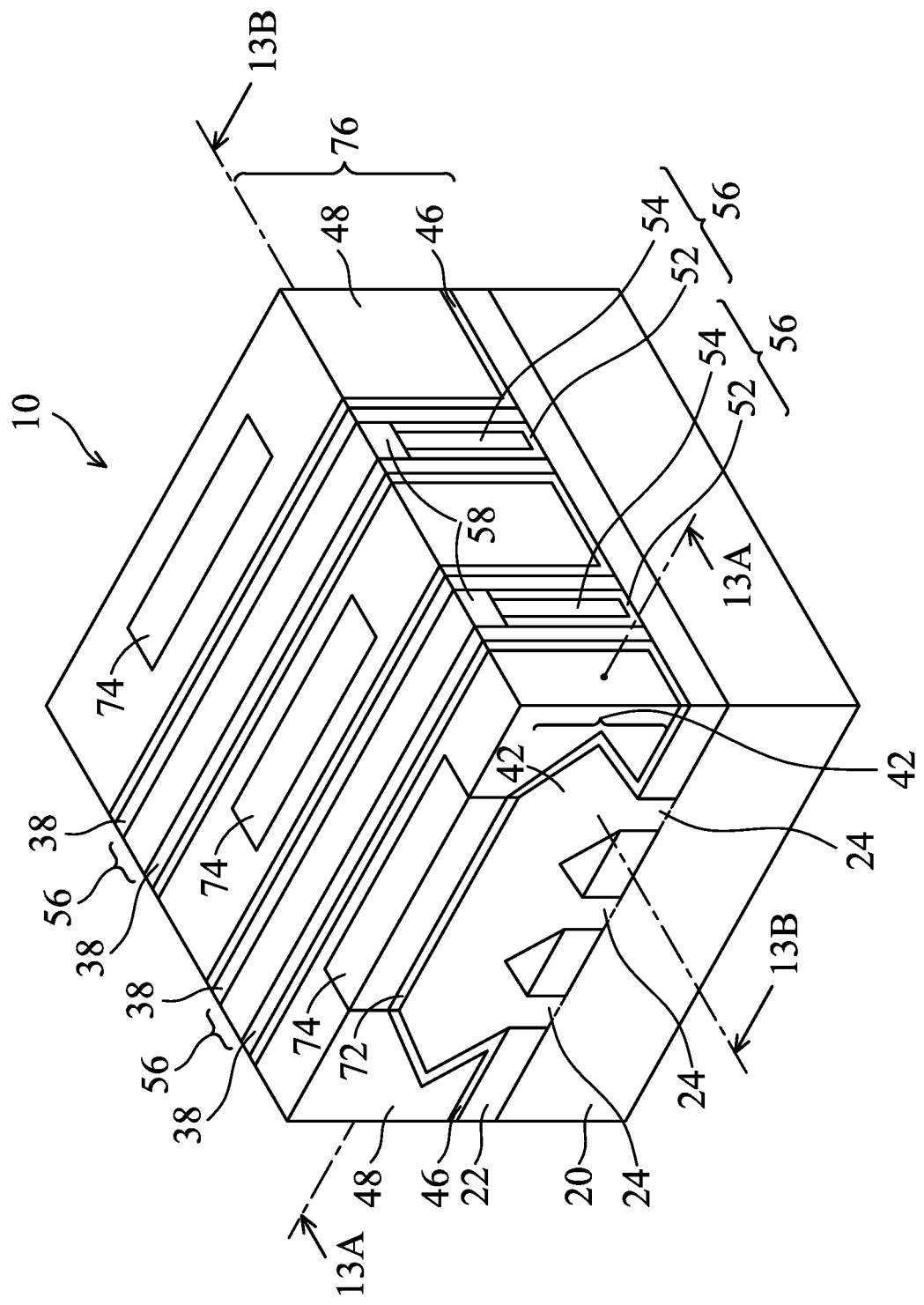

FIGS. 13B and 13C show a cross-sectional view and a perspective view of FinFET 76, respectively. The cross-sectional view shown in FIG. 13A is obtained from the vertical plane containing line 13A-13A in FIG. 13C. The cross-sectional view shown in FIG. 13B is obtained from the vertical plane containing line 13B-13B in FIG. 13C.

Figure 14:
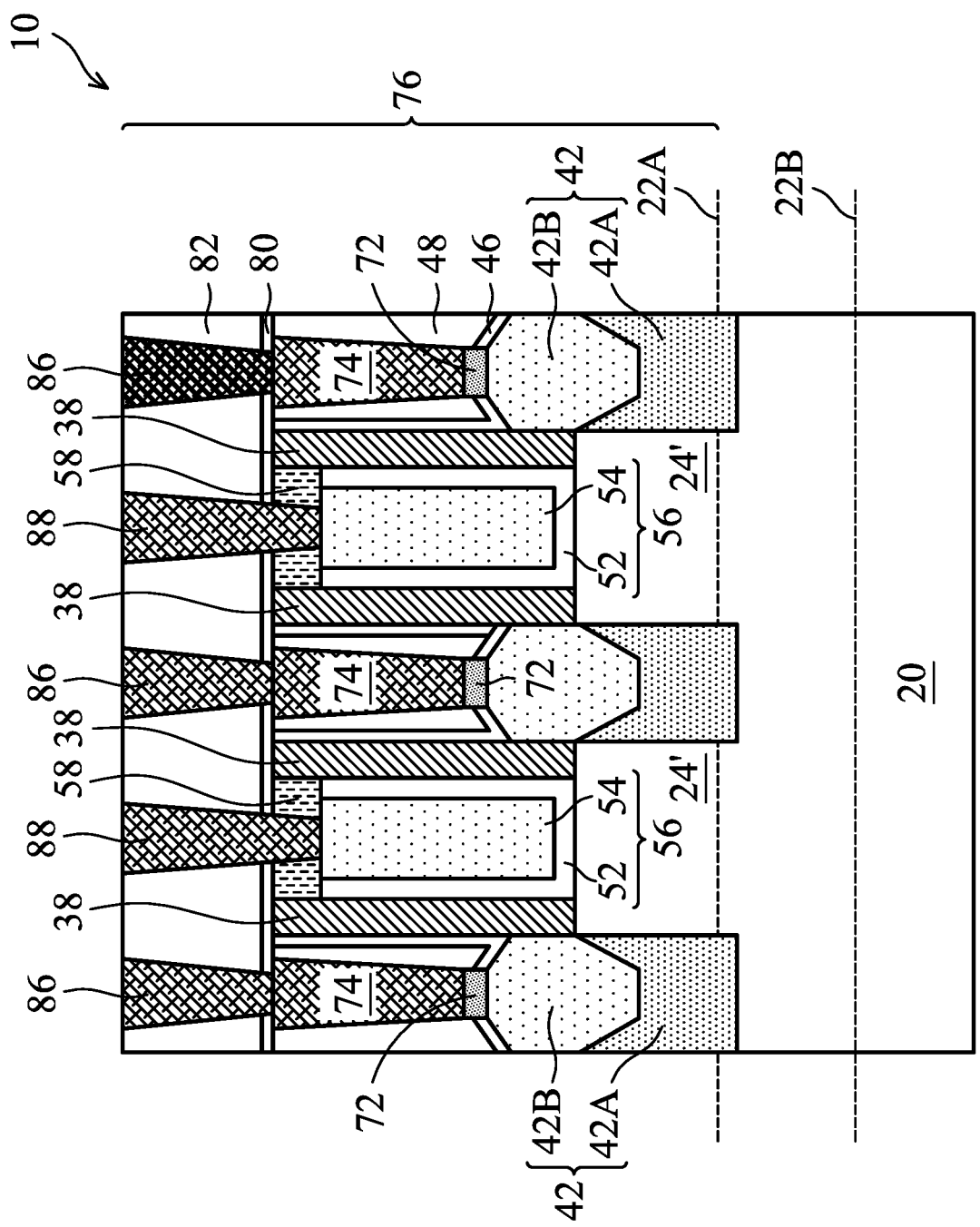

Referring to FIG. 14, in accordance with some embodiments of the present disclosure, etch stop layer 80 is formed. Etch stop layer 80 may be formed of SiN, SiCN, SiC, SiOCN, or another dielectric material. The formation method may include PECVD, ALD, CVD, or the like. Next, ILD 82 is formed over etch stop layer 80. The material of ILD 82 may be selected from the same candidate materials (and methods) for forming ILD 48. In accordance with some embodiments, ILD 82 is formed using PECVD, FCVD, spin-on coating, or the like.

ILD 82 and etch stop layer 80 are etched to form openings. The etching may be performed using, for example, Reactive Ion Etch (RIE). In a subsequent step, source/drain contact plugs 86 and gate contact plugs 88 are formed. In accordance with some embodiments of the present disclosure, contact plugs 86 and 88 include barrier layers and a metal-containing material over the corresponding barrier layers.

Figure 18:
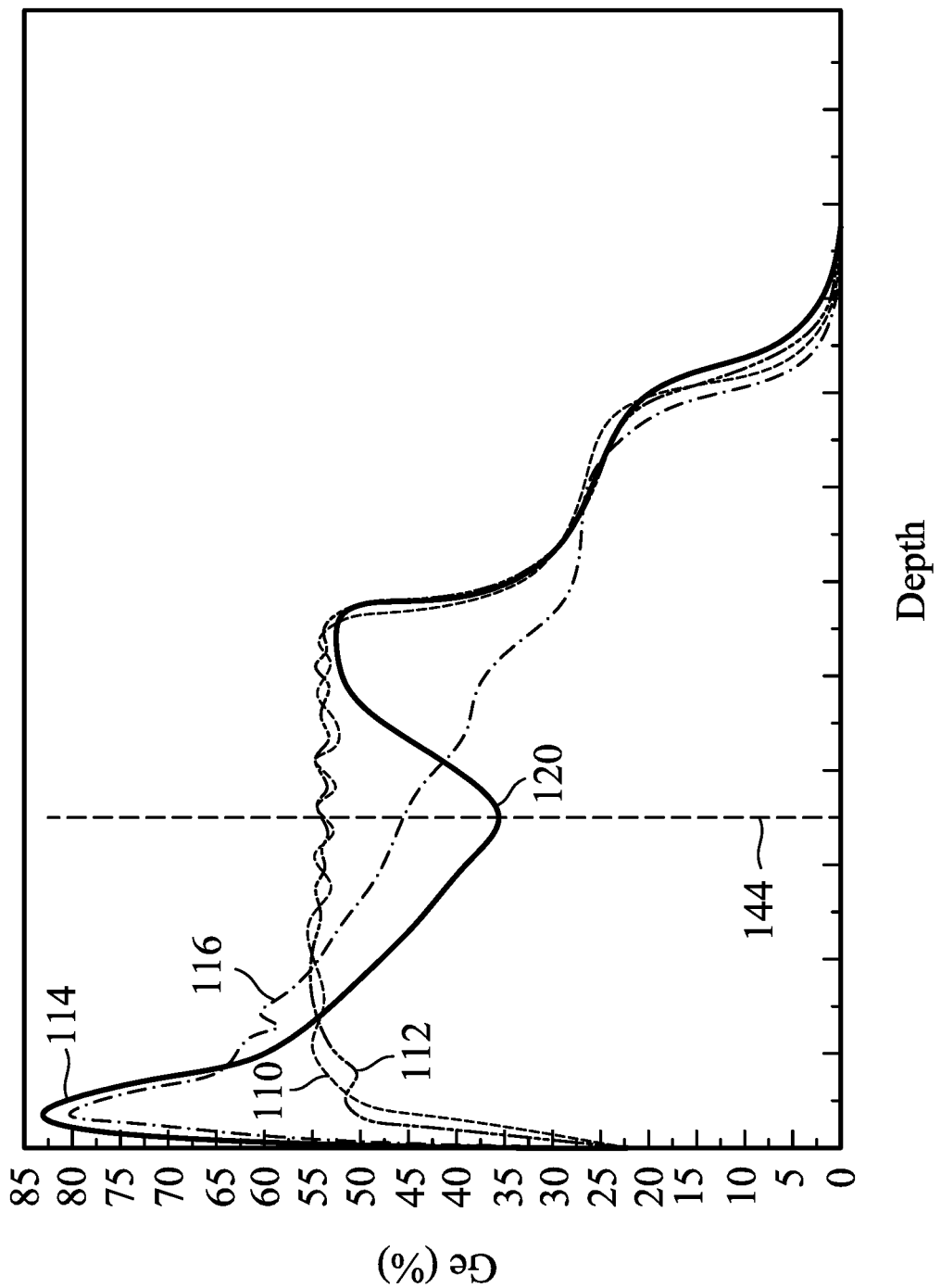
FIG. 18 illustrates the comparison of germanium percentages in accordance with some embodiments.

FIG. 18 illustrates experiment results of the germanium distribution in accordance with some embodiments, wherein germanium percentages are shown as a function of the depth into epitaxy silicon germanium region. The X-axis value of 0 corresponds to the top surface of epitaxy silicon germanium region, and the increase in the X-axis values corresponds to the increased depth into the silicon germanium region. Line 110 represents the germanium percentage before the PAI and anneal processes. Line 112 represents the germanium percentage after a non-melting anneal process is preformed. Line 112 is substantially overlapped with line 110, indicating that the non-melt anneal does not cause the redistribution of germanium. Line 114 represents the germanium percentage after a melting laser anneal process performed with a lower power (and lower temperature). Line 116 represents the germanium percentage after a melting laser anneal process performed with a higher power (and higher temperature). In lines 114 and 116, significant germanium redistribution caused by melting laser anneal is observed.

The embodiments of the present disclosure have some advantageous features. The melting laser anneal causes the germanium to be concentrated to the top surfaces of source/drain regions. Since the germanium atomic percentage is high where the source/drain regions contact the source/drain silicide regions, the Schottky barrier height is reduced, and contact resistance is reduced. Due to the liquidation and re-crystallization caused by the melting laser anneal, the defects in source/drain region may be eliminated. Furthermore, the depths of the molten regions may be controlled by forming air gaps, amorphization implantation, and multi-short anneals. In addition, the melting laser anneal may fully fix the defects caused by the implantation of the source/drain regions, which defects may cause the voids at the interface between silicide regions and epitaxy regions.

In accordance with some embodiments of the present disclosure, a method includes forming a gate stack over a first portion of a first semiconductor region; removing a second portion of the first semiconductor region on a side of the gate stack to form a recess; growing a second semiconductor region starting from the recess; implanting the second semiconductor region with an impurity; and performing a melting laser anneal on the second semiconductor region, wherein a first portion of the second semiconductor region is molten during the melting laser anneal, and a second and a third portion of the second semiconductor region on opposite sides of the first portion are un-molten. In an embodiment, the melting laser anneal comprises a plurality of laser shots. In an embodiment, the first portion overlaps an air gap, and the second portion and the third portion overlap, and are connected to, semiconductor strips extending between isolation regions. In an embodiment, portions of the first portion exposed to the air gap are not molten during the melting laser anneal. In an embodiment, the second semiconductor region is implanted to a depth smaller about ⅔ of a depth of the air gap. In an embodiment, the second semiconductor region comprises a lower portion and an upper portion over the lower portion, and in the melting laser anneal, the lower portion is not molten, and the upper portion is molten. In an embodiment, the lower portion has a first germanium percentage lower than a second germanium percentage of the upper portion. In an embodiment, the implanting the second semiconductor region is performed using silicon, germanium, or an inert gas. In an embodiment, the method further comprises depositing a contact etch stop layer over the second semiconductor region; forming an inter-layer dielectric over the contact etch stop layer; and etching the inter-layer dielectric and the contact etch stop layer to form a contact opening, wherein the implanting and the melting laser anneal are performed through the contact opening.

In accordance with some embodiments of the present disclosure, a method includes etching a portion of a semiconductor fin on a side of a gate stack to form a recess; epitaxially growing a silicon germanium layer comprising: a first portion and a second portion overlapping and connected to a first semiconductor strip and a second semiconductor strip, respectively; and a third portion interconnecting the first portion and the second portion; performing a melting laser anneal, with the melting laser anneal performed through a plurality of laser shots; and forming a silicide layer over and contacting the silicon germanium layer. In an embodiment, the melting laser anneal comprises three laser shots. In an embodiment, intervals between the plurality of laser shots are shorter than one second. In an embodiment, during the melting laser anneal, the third portion of the silicon germanium layer has at least an upper portion molten, and the first portion and the second portion are not molten. In an embodiment, the third portion of the silicon germanium layer further comprises a lower portion, and wherein the lower portion is un-molten during the melting laser anneal. In an embodiment, the method further comprises amorphizing an upper portion of the silicon germanium layer to form an amorphous region, wherein a lower portion of the silicon germanium layer is under the amorphous region, and during the melting laser anneal, the amorphous region of the silicon germanium layer is molten, and the lower portion of the silicon germanium layer remains as a solid.

In accordance with some embodiments of the present disclosure, a device includes isolation regions; a first semiconductor strip and a second semiconductor strip between the isolation regions; a first semiconductor fin and a second semiconductor fin protruding higher than top surfaces of the isolation regions, wherein the first semiconductor fin and the second semiconductor fin overlap the first semiconductor strip and the second semiconductor strip, respectively; a gate stack on a top surface and a sidewall of each of the first semiconductor fin and the second semiconductor fin; a source/drain region on a side of the gate stack, wherein the source/drain region comprises silicon germanium, and the source/drain region comprises: a first portion and a second portion overlapping the first semiconductor strip and the second semiconductor strip, respectively, and a third portion between the first portion and the second portion of the source/drain region; and a silicide layer over and forming an interface with the source/drain region, wherein at the interface, the source/drain region comprises: a first point in a first middle line between the first semiconductor strip and the second semiconductor strip, wherein at the first point, the source/drain region has a first germanium atomic percentage; and a second point in a second middle line of the first semiconductor strip, wherein at the second point, the source/drain region has a second germanium atomic percentage higher than the first germanium atomic percentage. In an embodiment, the first germanium atomic percentage is higher than the second germanium atomic percentage by a difference greater than about 10 percent. In an embodiment, in the third portion of the source/drain region, germanium atom percentages reach a peak value at a position close to the interface. In an embodiment, the first germanium atomic percentage is in a range between about 50 percent and about 90 percent, and the second germanium atomic percentage is in a range between about 30 percent and about 70 percent. In an embodiment, from the first point down in the source/drain region, germanium atomic percentages decrease continuously.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate stack over a first portion of a first semiconductor region;
   removing a second portion of the first semiconductor region on a side of the gate stack to form a recess;
   growing a second semiconductor region starting from the recess;

implanting the second semiconductor region with an impurity; and performing a melting laser anneal on the second semiconductor region, wherein the performing the melting laser anneal comprises projecting a laser beam on an exposed top surface of the second semiconductor region, wherein a first portion of the second semiconductor region is molten during the melting laser anneal, and a second and a third portion of the second semiconductor region on opposite sides of the first portion are un-molten.

2. The method of claim 1, wherein the melting laser anneal comprises a plurality of laser shots.

3. The method of claim 1, wherein the first portion overlaps an air gap, and the second portion and the third portion overlap, and are connected to, semiconductor strips extending between isolation regions.

4. The method of claim 3, wherein portions of the first portion exposed to the air gap are not molten during the melting laser anneal.

5. The method of claim 3, wherein the second semiconductor region is implanted to a depth smaller about ⅔ of a depth of the air gap.

6. The method of claim 1, wherein the second semiconductor region comprises a lower portion and an upper portion over the lower portion, and in the melting laser anneal, the lower portion is not molten, and the upper portion is molten.

7. The method of claim 6, wherein the lower portion has a first germanium percentage lower than a second germanium percentage of the upper portion.

8. The method of claim 1, wherein the implanting the second semiconductor region is performed using silicon, germanium, or an inert gas.

9. The method of claim 1 further comprising:
depositing a contact etch stop layer over the second semiconductor region;
forming an inter-layer dielectric over the contact etch stop layer; and
etching the inter-layer dielectric and the contact etch stop layer to form a contact opening, wherein the implanting and the melting laser anneal are performed through the contact opening.

10. A method comprising:
etching a portion of a semiconductor fin on a side of a gate stack to form a recess;
epitaxially growing a silicon germanium layer comprising:
a first portion and a second portion overlapping and connected to a first semiconductor strip and a second semiconductor strip, respectively; and
a third portion interconnecting the first portion and the second portion;
performing a melting laser anneal, with the melting laser anneal performed through a plurality of laser shots, wherein during the melting laser anneal the third portion has a slower heat dissipation rate than the first portion and the second portion; and
forming a silicide layer over and contacting the silicon germanium layer.

11. The method of claim 10, wherein the melting laser anneal comprises three laser shots.

12. The method of claim 11, wherein intervals between the plurality of laser shots are shorter than one second.

13. The method of claim 10, wherein during the melting laser anneal, the third portion of the silicon germanium layer has at least an upper portion molten, and the first portion and the second portion are not molten.

14. The method of claim 10, wherein the third portion of the silicon germanium layer further comprises a lower portion, and wherein the lower portion is un-molten during the melting laser anneal.

15. The method of claim 14 further comprising:
amorphizing an upper portion of the silicon germanium layer to form an amorphous region, wherein a lower portion of the silicon germanium layer is under the amorphous region, and during the melting laser anneal, the amorphous region of the silicon germanium layer is molten, and the lower portion of the silicon germanium layer remains as a solid.

16. A device comprising:
isolation regions;
a first semiconductor strip and a second semiconductor strip between the isolation regions;
a first semiconductor fin and a second semiconductor fin protruding higher than top surfaces of the isolation regions, wherein the first semiconductor fin and the second semiconductor fin overlap the first semiconductor strip and the second semiconductor strip, respectively;
a gate stack on a top surface and a sidewall of each of the first semiconductor fin and the second semiconductor fin;
a source/drain region on a side of the gate stack, wherein the source/drain region comprises silicon germanium, and the source/drain region comprises:
a first portion and a second portion overlapping the first semiconductor strip and the second semiconductor strip, respectively, and
a third portion between the first portion and the second portion of the source/drain region; and
a silicide layer over and forming an interface with the source/drain region, wherein at the interface, the source/drain region comprises:
a first point in a first middle line between the first semiconductor strip and the second semiconductor strip, wherein at the first point, the source/drain region has a first germanium atomic percentage; and
a second point in a second middle line of the first semiconductor strip, wherein at the second point, the source/drain region has a second germanium atomic percentage lower than the first germanium atomic percentage, wherein from the first point down in the source/drain region, germanium atomic percentages decrease continuously.

17. The device of claim 16, wherein the first germanium atomic percentage is higher than the second germanium atomic percentage by a difference greater than about 10 percent.

18. The device of claim 16, wherein in the third portion of the source/drain region, germanium atom percentages reach a peak value at a position close to the interface.

19. The device of claim 16, wherein the first germanium atomic percentage is in a range between about 50 percent and about 90 percent, and the second germanium atomic percentage is in a range between about 30 percent and about 70 percent.

20. The device of claim 16, wherein a top surface of the source/drain region is continuously curved and continuously rounded.

* * * * *